United States Patent
Fujii

(10) Patent No.: US 11,296,035 B2
(45) Date of Patent: Apr. 5, 2022

(54) SEMICONDUCTOR WAFER AND SEMICONDUCTOR CHIP

(71) Applicant: Kioxia Corporation, Minato-ku (JP)

(72) Inventor: Mika Fujii, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 85 days.

(21) Appl. No.: 16/796,493

(22) Filed: Feb. 20, 2020

(65) Prior Publication Data
US 2021/0066202 A1    Mar. 4, 2021

(30) Foreign Application Priority Data
Aug. 30, 2019   (JP) .............................. JP2019-158032

(51) Int. Cl.
*H01L 23/544* (2006.01)
*H01L 21/82* (2006.01)

(52) U.S. Cl.
CPC ............ *H01L 23/544* (2013.01); *H01L 21/82* (2013.01); *H01L 2223/5446* (2013.01)

(58) Field of Classification Search
CPC ............... H01L 23/544; H01L 21/82; H01L 2223/5446; H01L 23/3185; H01L 2221/68336; H01L 2221/68381; H01L 2221/68327; H01L 21/6836; H01L 21/78; H01L 29/0657; H01L 29/0684; H01L 21/3043
See application file for complete search history.

(56) References Cited

U.S. PATENT DOCUMENTS

| 4,096,619 A | 6/1978 | Cook, Jr. et al. |
| 6,214,703 B1 | 4/2001 | Chen et al. |
| 10,418,335 B2 | 9/2019 | Cho et al. |
| 2010/0148315 A1* | 6/2010 | Kumakawa ............ B23K 26/53 |
| | | 257/620 |
| 2011/0050047 A1 | 3/2011 | Numata |
| 2015/0255373 A1* | 9/2015 | Watanabe ............... H01L 24/73 |
| | | 257/48 |
| 2018/0261555 A1 | 9/2018 | Cho et al. |
| 2019/0355671 A1 | 11/2019 | Cho et al. |

FOREIGN PATENT DOCUMENTS

| CN | 102117776 A | 7/2011 |
| CN | 104916580 A | 9/2015 |
| JP | 3306889 B2 | 7/2002 |
| JP | 2011-46581 A | 3/2011 |
| JP | 5127669 B2 | 1/2013 |
| TW | 201843721 A | 12/2018 |

* cited by examiner

Primary Examiner — Kyoung Lee
(74) Attorney, Agent, or Firm — Oblon, McClelland, Maier & Neustadt, L.L.P.

(57) ABSTRACT

According to one embodiment, a semiconductor wafer includes a plurality of chip regions, a plurality of chip regions, a device layer, a first structure, and a second structure. The device layer includes an integrated circuit formed in each of the chip regions. The first structure is formed in the kerf region by filling a first cavity with a first filling material. The first cavity extends vertically with respect to a surface of a semiconductor substrate. The second structure is formed in the device layer by filling a second cavity with a second filling material. The second cavity extends vertically with respect to the surface of the semiconductor substrate.

20 Claims, 18 Drawing Sheets

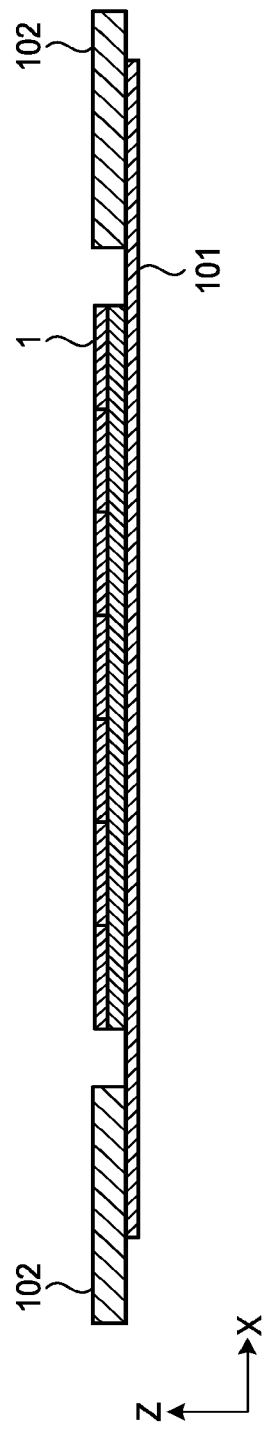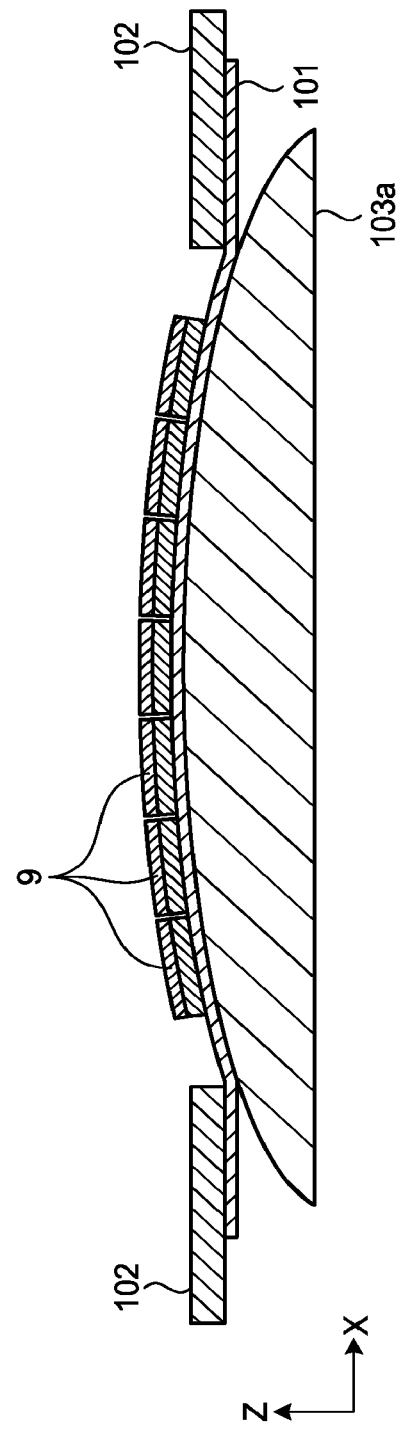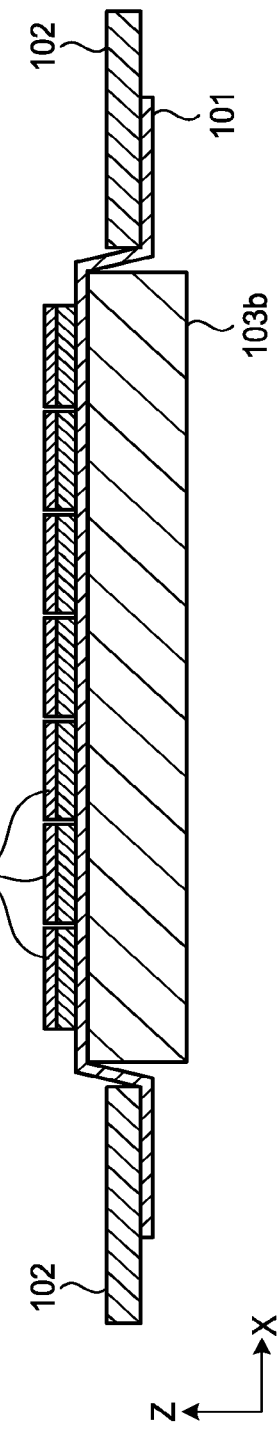

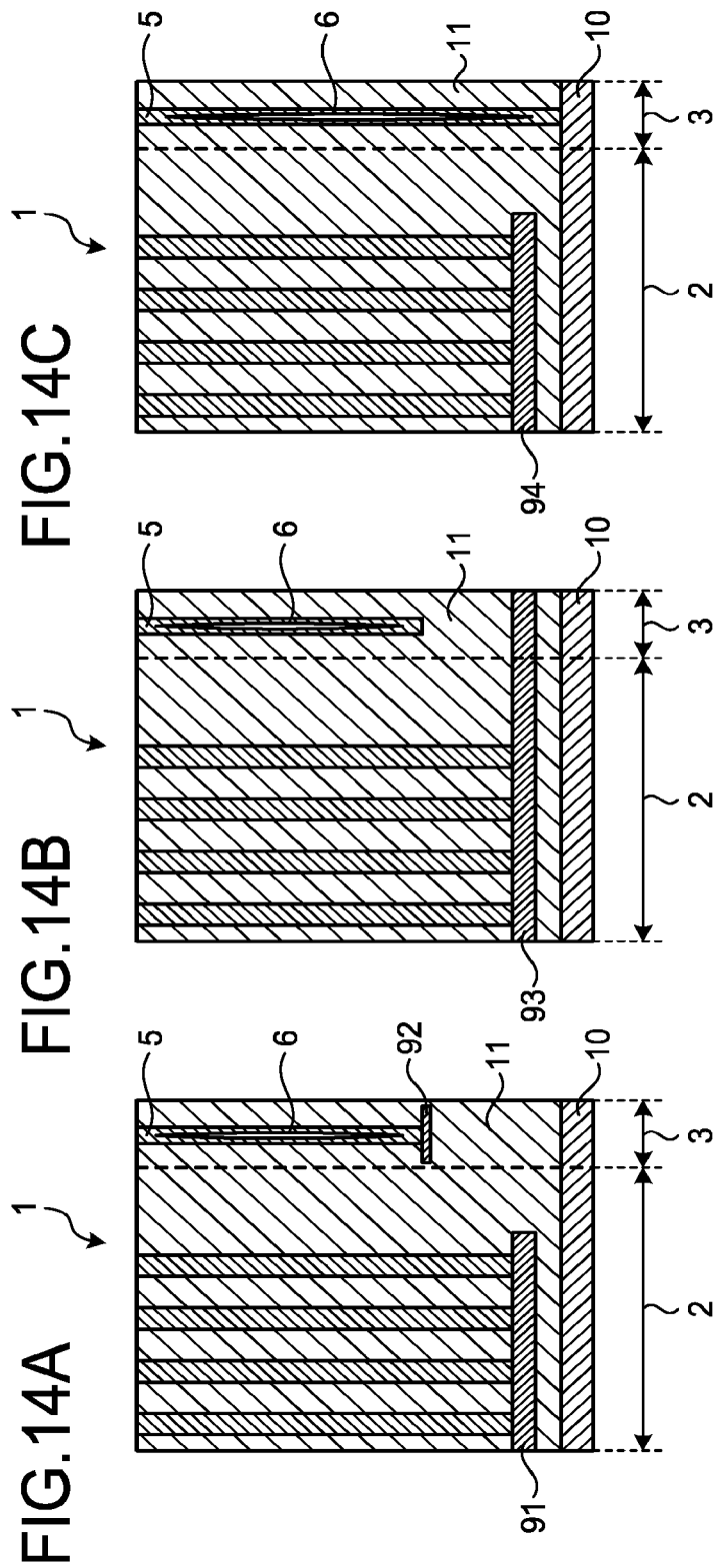

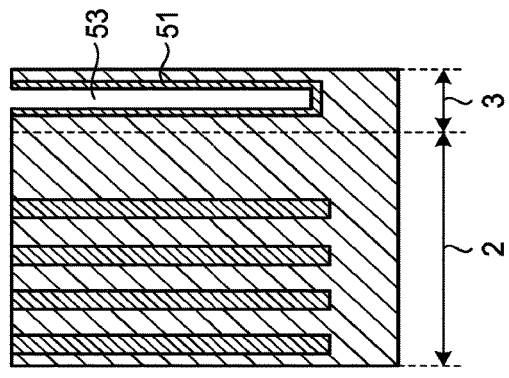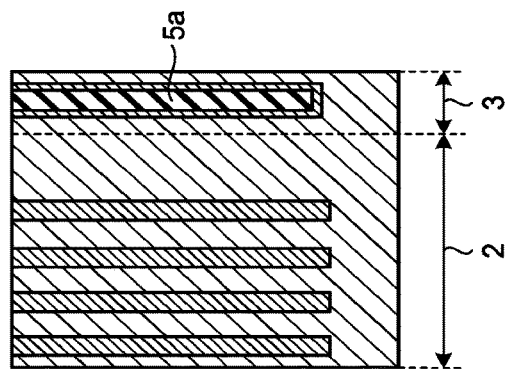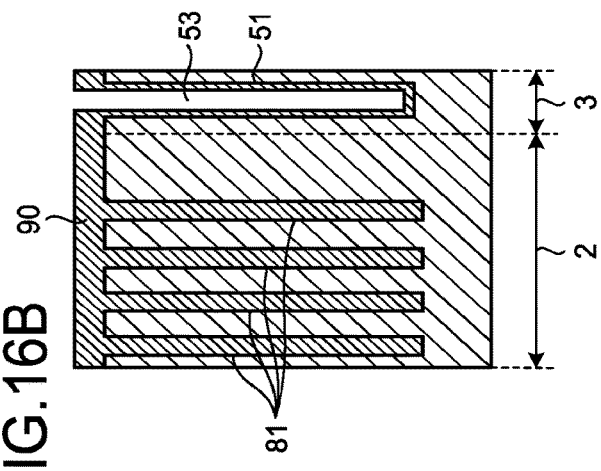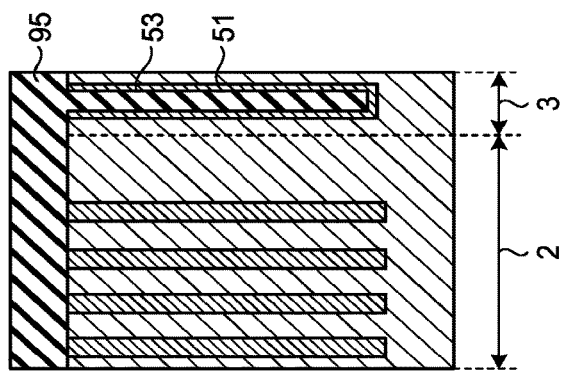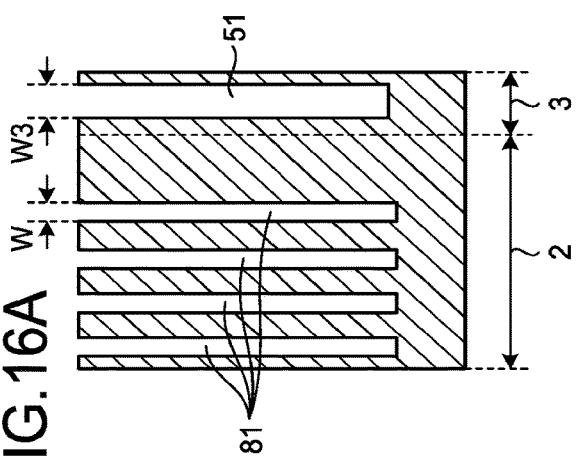

(12) United States Patent

SEMICONDUCTOR WAFER AND SEMICONDUCTOR CHIP

CROSS-REFERENCE TO RELATED APPLICATIONS

This application is based upon and claims the benefit of priority from Japanese Patent Application No. 2019-158032, filed on Aug. 30, 2019; the entire contents of which are incorporated herein by reference.

FIELD

Embodiments described herein relate generally to a semiconductor wafer and a semiconductor chip.

BACKGROUND

Semiconductor chips are produced by individually separating multiple chip regions of a semiconductor wafer by dicing. Regions to be sacrificed by dicing are provided in-between the chip regions. Such regions may be referred to as kerf regions.

Conventionally, semiconductor wafer dicing methods are known. Such a dicing method includes forming scribe lines in dicing streets with blades and warping or press-bending a substrate by applying an external force to the side opposite the scribe lines, for example.

BRIEF DESCRIPTION OF THE DRAWINGS

FIGS. 6A to 6C are schematic views illustrating an exemplary method of applying stress to the semiconductor wafer according to the first embodiment with a dicing device;

FIGS. 14A to 14C are schematic views illustrating different controlling methods of the depth of cavities in the first embodiment;

FIGS. 16A to 16E are schematic views illustrating an example of forming the dicing boundary structure in the second embodiment;

DETAILED DESCRIPTION

According to one embodiment, in general, a semiconductor wafer includes a plurality of chip regions, a plurality of chip regions, a device layer, a first structure, and a second structure. The device layer includes an integrated circuit formed in each of the chip regions. The first structure is formed in the kerf region by filling a first cavity with a first filling material. The first cavity extends vertically with respect to a surface of a semiconductor substrate. The second structure is formed in the device layer by filling a second cavity with a second filling material. The second cavity extends vertically with respect to the surface of the semiconductor substrate.

Hereinafter, exemplary embodiments of a semiconductor wafer and a semiconductor chip will be explained in detail with reference to the accompanying drawings. The exemplary embodiments are merely illustrative and not intended to limit the scope of the present invention.

First Embodiment

Figure 1:
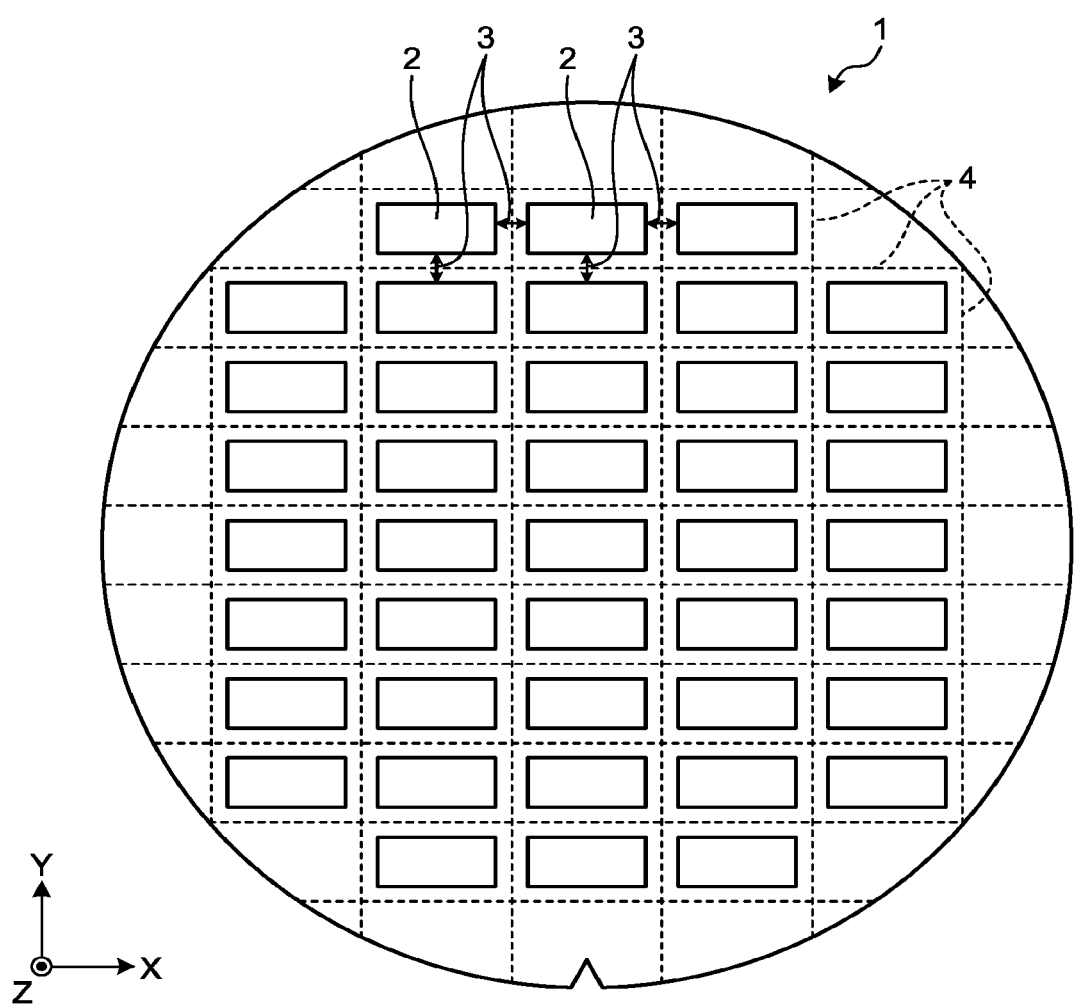
FIG. 1 is a plan view of the front surface of an exemplary semiconductor wafer according to a first embodiment.
Figure 2:
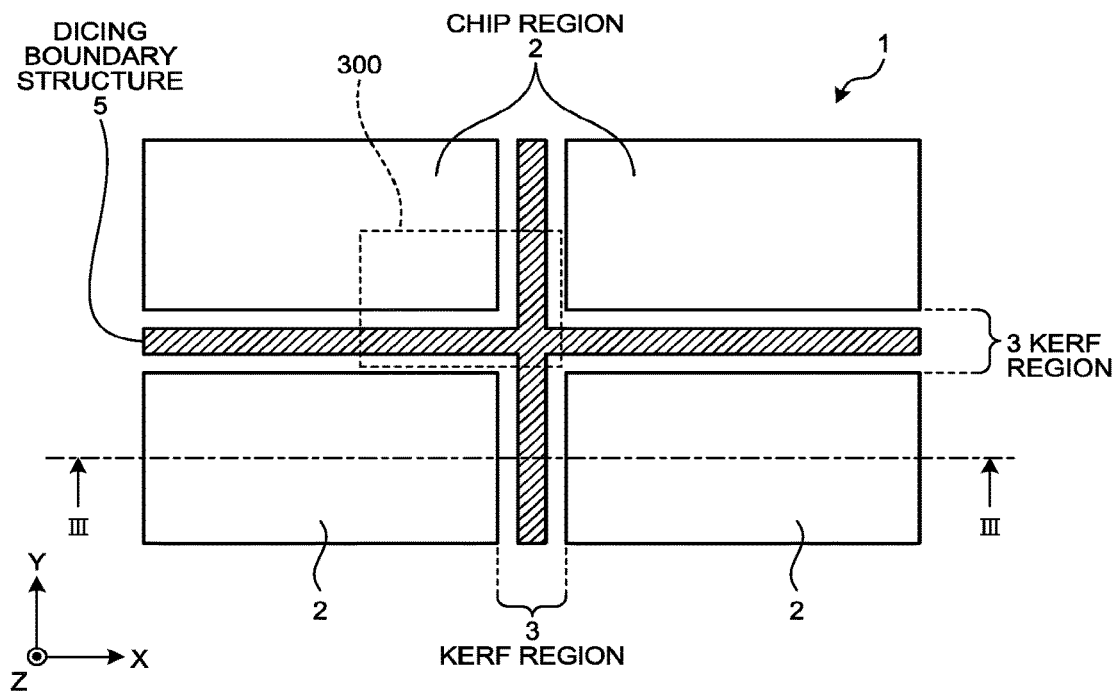
FIG. 2 is a partially enlarged plan view of a dicing boundary structure on the front surface of the semiconductor wafer according to the first embodiment, by way of example.

FIG. 1 is a plan view of the front surface of an exemplary semiconductor wafer 1 according to a first embodiment. FIG. 2 is a partially enlarged plan view of the front surface of the semiconductor wafer 1 according to the first embodiment. The semiconductor wafer 1 includes a plurality of chip regions 2 in the form of a matrix. In this example, the chip regions 2 have a rectangular shape. The shape of the chip regions 2 is not limited thereto. The chip regions 2 are spaced apart from each other. Regions in-between the chip regions 2 are kerf regions 3 that may be sacrificed at the time of dicing.

A dicing boundary structure 5 as a first structure is placed in the kerf region 3. Specifically, for example, the dicing boundary structure 5 is placed on lines 4. Thus, the chip regions 2 are individually surrounded by the dicing boundary structure 5.

In dicing, the semiconductor wafer 1 is cut at the positions of the dicing boundary structure 5. Thereby, the chip regions 2 are separated from each other.

The chip regions 2 are individually packaged after being separated. The individual chip regions 2 before or after packaging are exemplary semiconductor chips of the embodiment.

In the following drawings, a direction from the rear surface to the front surface of the semiconductor wafer 1 is defined to be a positive direction of a Z axis. A longitudinal direction of the chip region 2 is defined to be a positive direction of an X axis. A transverse direction of the chip region 2 is defined to be a positive direction of a Y axis.

Figure 3:
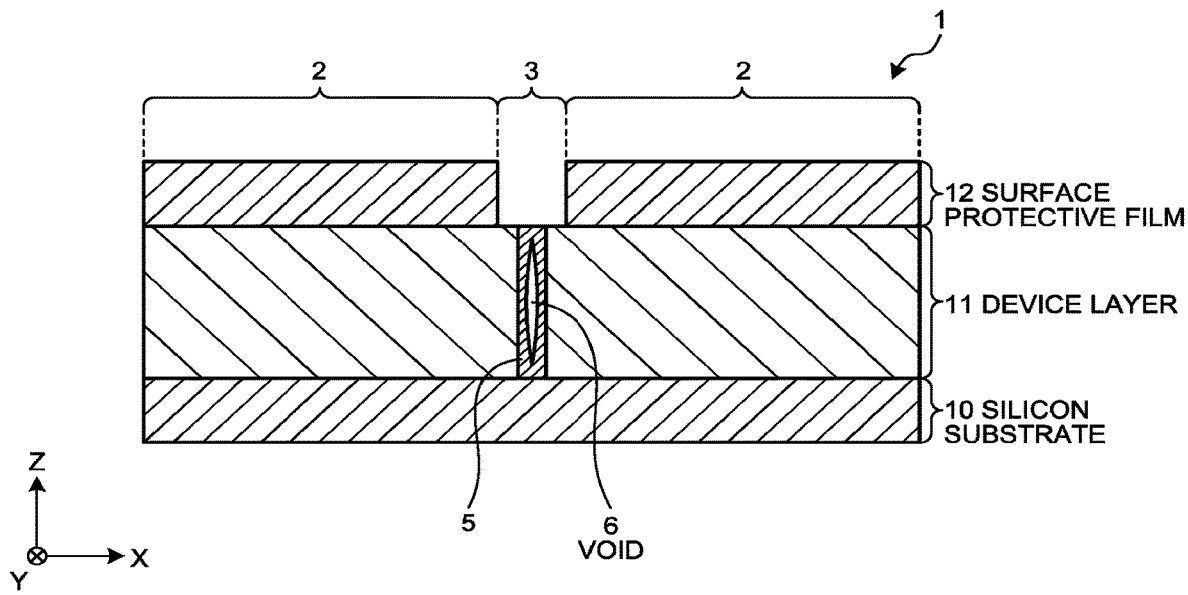
FIG. 3 is a sectional view taken along a section line in FIG. 2.

FIG. 3 is a sectional view of the semiconductor wafer 1 taken along a section line in FIG. 2.

As illustrated in FIG. 3, a device layer 11 is formed on a silicon substrate 10 being a semiconductor substrate. The device layer 11 includes one or more layers formed on the silicon substrate 10 by deposition. As will be described later in detail, integrated circuits are formed in the respective chip regions 2 of the device layer 11. The surface of each of the chip regions 2 is coated with a surface protective film 12. Alternatively, the surface protective film 12 may be omitted.

In the kerf regions 3, the dicing boundary structure 5 is placed, extending through the device layer 11 along the thickness of the semiconductor wafer 1. As illustrated in FIG. 2, the dicing boundary structure 5 is in the form of a wall that partitions the chip regions 2, by way of example. That is, the wall-like dicing boundary structure 5 stands along the lines 4 in FIG. 1, for example.

As illustrated in the sectional view of FIG. 3, the dicing boundary structure 5 is provided with a void 6 inside. The dicing boundary structure 5 is formed by forming a cavity in the device layer 11 and depositing a filling material in the cavity. The filling material is deposited in the cavity by chemical vapor deposition (CVD) or sputtering, for example. The opening size of the cavity is set so as to facilitate the creation of the void at the time of depositing the filling material by such a method. Thereby, the dicing boundary structure 5 has the void 6 formed inside. The method of depositing the filling material is not limited to chemical vapor deposition and sputtering.

Figure 4A:
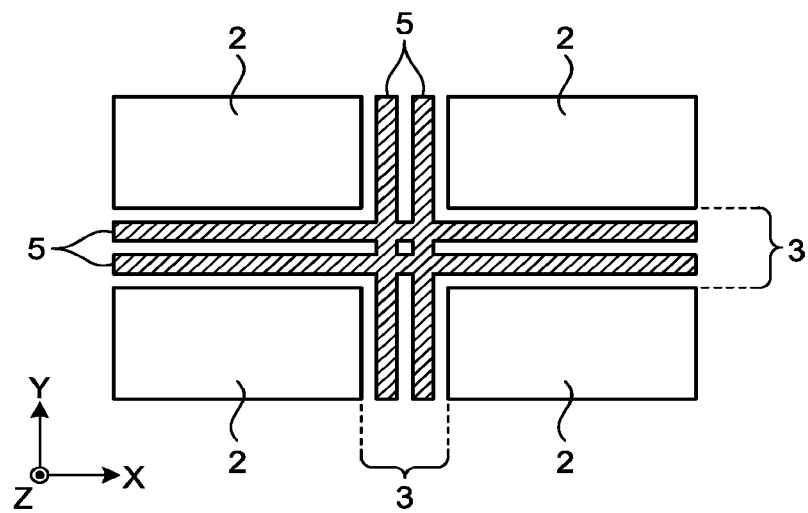
FIGS. 4A to 4C are schematic views illustrating different arrangements and shapes of the dicing boundary structure according to the first embodiment.
Figure 4B:
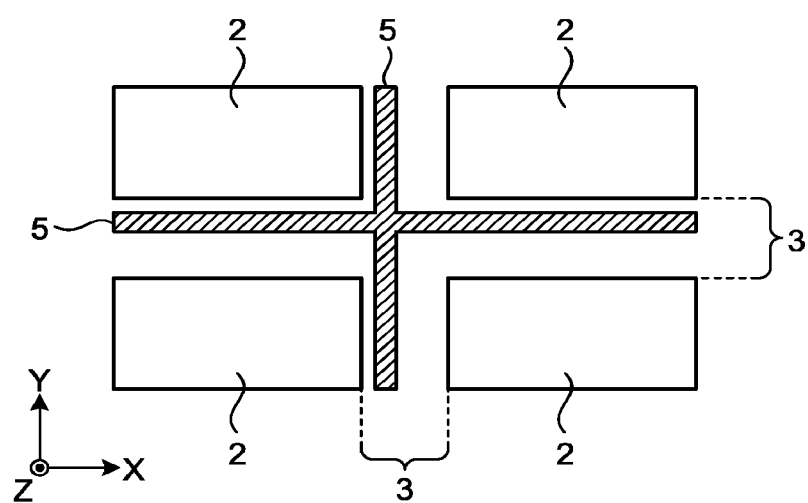
Figure 4C:
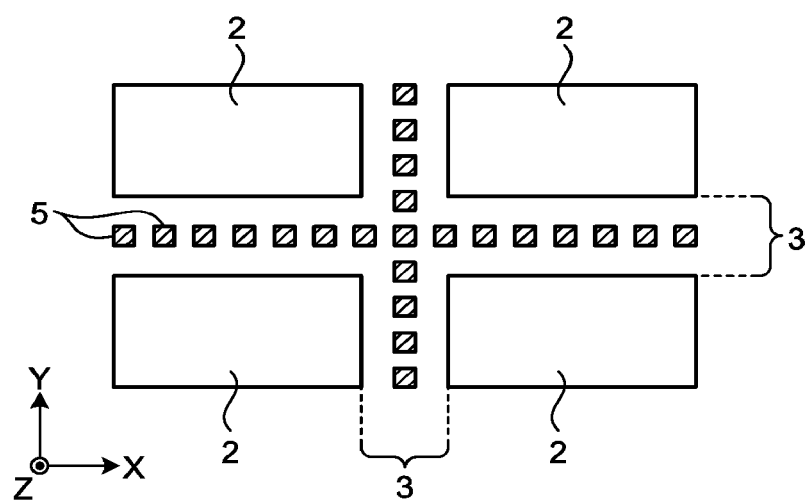

The arrangement and shape of the dicing boundary structure 5 are not limited to the above example. FIGS. 4A to 4C are schematic views illustrating different arrangements and shapes of the dicing boundary structure 5 according to the first embodiment.

For example, as illustrated in FIG. 4A, the wall-like dicing boundary structure 5 may be disposed dually in the kerf regions 3. As illustrated in FIG. 4B, the wall-like dicing boundary structure 5 may be disposed in an unbalanced manner along the width of the kerf region 3. Placing the wall-like dicing boundary structure 5 to surround the chip regions 2 can facilitate separation of the chip regions 2.

As illustrated in FIG. 4C, a plurality of dicing boundary structures 5 of a columnar shape may be arranged. Arranging the columnar dicing boundary structures 5 to surround the chip regions can facilitate separation of the chip regions 2, as with the wall-like dicing boundary structure 5. The columnar dicing boundary structures 5 may be in the form of a rectangular column or a cylinder.

Hereinafter, the dicing boundary structure 5 of a wall form will be described, unless otherwise noted.

Figure 5A:
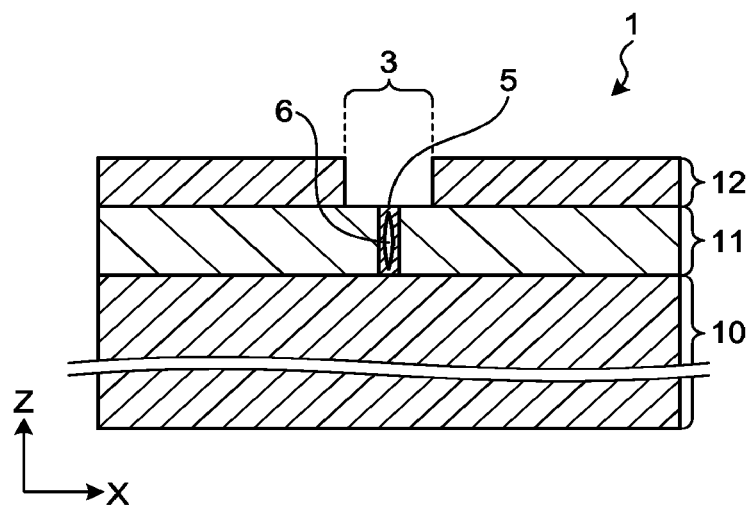
FIGS. 5A to 5C are schematic views illustrating a separation of chip regions from the semiconductor wafer according to the first embodiment.
Figure 5B:
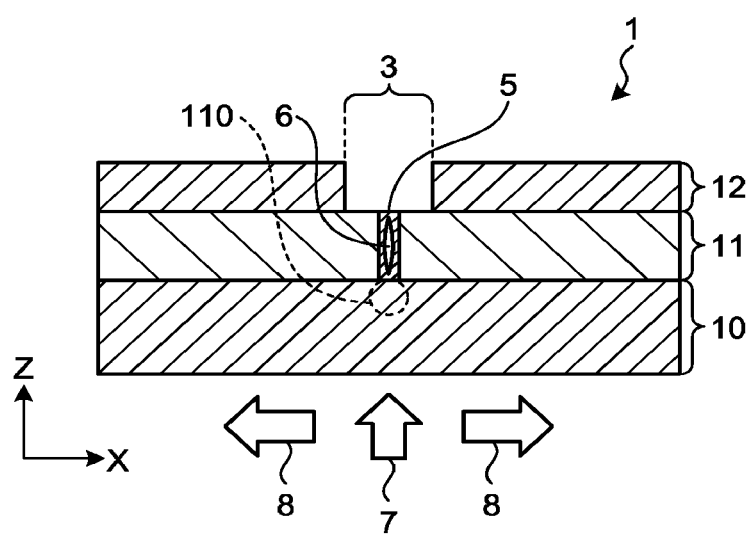
Figure 5C:
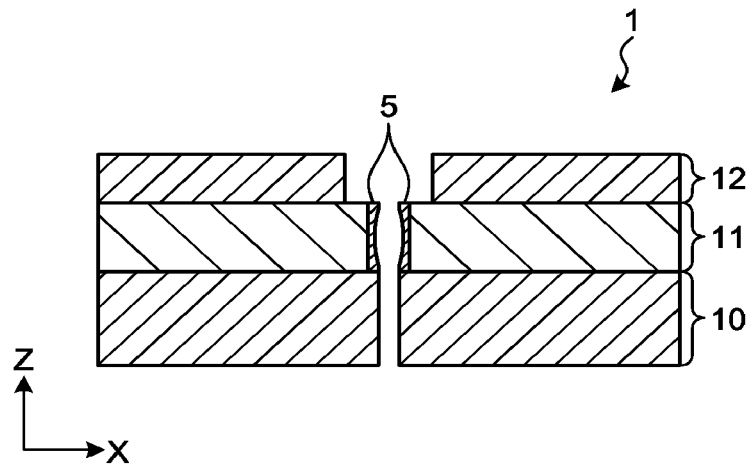

FIGS. 5A to 5C are schematic views illustrating separation of the chip regions 2 from the semiconductor wafer 1 according to the first embodiment.

FIG. 5A is a sectional view of the semiconductor wafer 1 including the dicing boundary structure 5 in the embodiment. The silicon substrate 10 of the semiconductor wafer 1 is thinned by back grinding. Then, as illustrated in FIG. 5B, the semiconductor wafer 1 is applied with bending stress from the rear side in a bending direction as indicated by the arrow 7, or with tensile stress in directions in which the chip regions 2 are moved away from each other, as indicated by the arrows 8.

The dicing boundary structure 5 extends through the device layer 11 along the thickness of the semiconductor wafer 1, and is provided with the void 6 inside, so that the dicing boundary structure 5 is fragile as compared with the other elements on the semiconductor wafer 1. Because of this, the applied stress in the direction indicated by the arrow 7 or 8 concentrates on the position of the dicing boundary structure 5 (a portion 110) on the semiconductor wafer 1, causing crack in the portion 110. Continuously applied stress causes the crack to grow towards the rear surface of the semiconductor wafer 1, and the semiconductor wafer 1 is cut at the position of the dicing boundary structure 5 in the end, as illustrated in FIG. 5C.

For the sake of comparison with this embodiment, the kerf region 3 may be provided with a cavity such as a groove, which will be referred to as a comparative example. According to the comparative example, the position of the cavity is more fragile than the rest, so that the semiconductor wafer can be cut at the position of the cavity, as with the dicing boundary structure 5. However, the semiconductor wafer may be unintentionally cut at the cavity position by back grinding, for example.

According to the embodiment, the dicing boundary structure 5 is formed by filling the cavity with the filling material, therefore, the position of the dicing boundary structure 5 is less fragile than the one with a mere cavity. This makes it possible to avoid the semiconductor wafer from being unintentionally cut or torn by back grinding.

A braking device or an expander is provided to apply the stress in the direction indicated by the arrow 7 or 8, for example.

FIGS. 6A to 6C are schematic views illustrating an exemplary method of applying stress to the semiconductor wafer 1 with an expander in the first embodiment.

For example, as illustrated in FIG. 6A, the rear surface of the semiconductor wafer 1 is adhered to a support tape 101. Both ends of the support tape 101 are supported by supports 102. The support tape 101 is also referred to as a dicing tape.

Subsequently, as illustrated in FIG. 6B, the support tape 101 is pressed to a board 103a having a protruded surface, for example. The support tape 101 is bent along the protruded board 103a, thereby applying bending stress to the rear surface of the semiconductor wafer 1 adhered to the support tape 101 in the direction indicated by the arrow 7 in FIGS. 5A to 5C. As a result, the semiconductor wafer 1 is cut at the positions of the dicing boundary structure 5.

In another example, as illustrated in FIG. 6C, the support tape 101 is pressed onto a flat board 103b greater in diameter than the semiconductor wafer 1. Thereby, the support tape 101 is expanded, resulting in applying tensile stress to the semiconductor wafer 1 adhered to the support tape 101 in the direction indicated by the arrow 8 in FIGS. 5A to 5C. The semiconductor wafer 1 is thus cut at the positions of the dicing boundary structure 5.

As described above, according to the embodiment, it is possible to separate individual semiconductor chips 9 from the semiconductor wafer 1 by dicing without machining scribe lines with blades. That is, semiconductor chips 9 each including a semiconductor substrate are individually separable from the semiconductor wafer 1 easily.

After cutting the semiconductor wafer 1 at the positions of the dicing boundary structure 5, the material of the dicing boundary structure 5 remains on the lateral surface of each semiconductor chip 9 produced by dicing. As illustrated in FIG. 5C, the device layer 11 may have differ film compositions in the lateral surface and a portion slightly more inside therefrom.

Figure 7A:
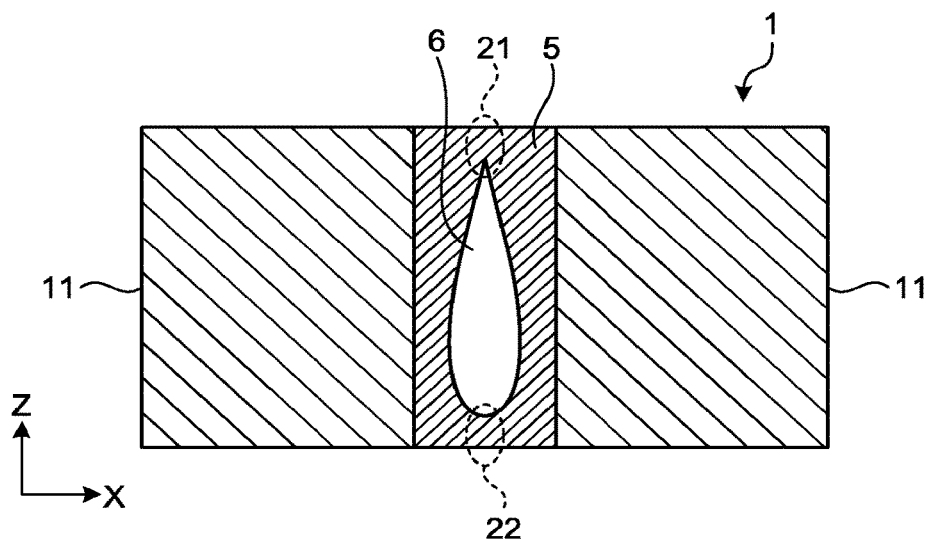
FIGS. 7A to 7C are schematic views illustrating an exemplary state of the lateral surface of a semiconductor chip produced by dicing in the first embodiment.
Figure 7B:
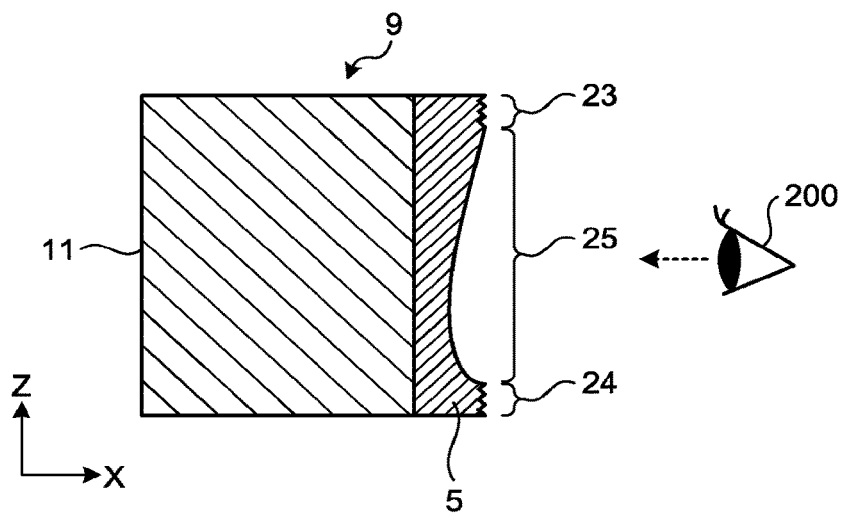
Figure 7C:
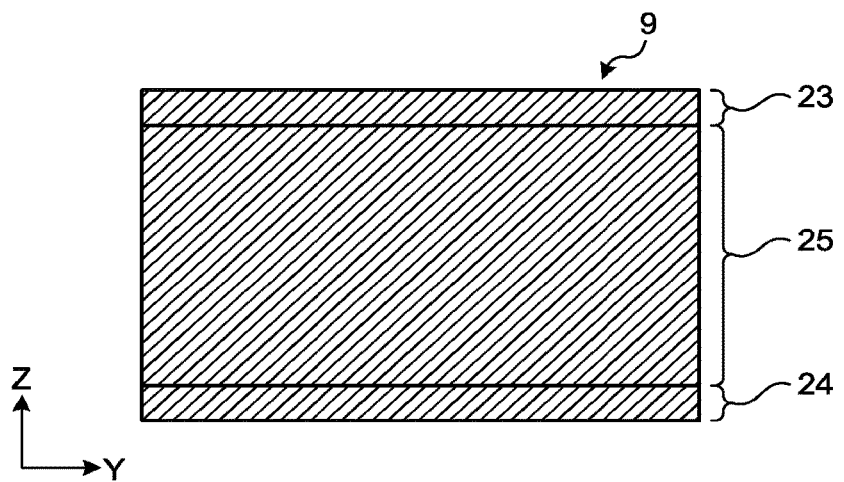

FIGS. 7A to 7C are schematic views illustrating an exemplary state of the lateral surface of the semiconductor chip 9 produced by dicing in the first embodiment. FIGS. 7A to 7C illustrate only the device layer 11 among the layers of the semiconductor chip 9.

FIG. 7A illustrates the dicing boundary structure 5 before dicing. As illustrated in this drawing, the cross section of the void 6 has a shape extending long and thin along the thickness of the device layer 11. Thus, during dicing, stress concentration occurs on the thin area of the dicing boundary structure 5, specifically, a portion 21 above the top end of the long and thin void 6 and a portion 22 below the bottom end of the void 6. Thus, as illustrated in FIG. 7B, the dicing boundary structure 5 is cut at the portion 21 and the portion 22 by dicing.

FIG. 7B illustrates the semiconductor chip 9 produced by dicing the semiconductor wafer 1. As illustrated in this drawing, in the surface of the semiconductor wafer 1 formed by dicing, that is, the lateral surface of the semiconductor chip 9, surfaces 23 and 24 of the portion 21 and the portion 22 of the dicing boundary structure 5, and an inner wall 25 of the void 6 are exposed. In the case of the dicing boundary structure 5 formed of the filling material deposited by chemical vapor deposition or sputtering, for example, the inner wall 25 of the void 6 exhibits smoother surface roughness than the cut surfaces 23 and 24. The filling-material film attached onto the lateral surface of the semiconductor chip 9 is thicker in thickness on the cut surfaces 23 and 24 than on the inner wall 25 of the void 6. From the surface of the semiconductor wafer 1 towards the surface of the device layer 11 in a direction vertical to the surface of the semiconductor wafer 1, the surface of the film as the partially remaining dicing boundary structure 5 is inclined from a kerf region side toward the device layer 11. The surface of the film as the partially remaining dicing boundary structure 5 is then inclined toward the kerf region after most closely approaching the device layer 11.

FIG. 7C is a diagram of the lateral surface of the semiconductor chip 9 as seen from an observing point 200 in FIG. 7B. In this example, the cut surface of the device layer 11 is covered with the filling-material film of the dicing boundary structure 5. The cut surface 23 is formed on the film on the front side of the semiconductor wafer 1 (a positive side of the Z axis), and the cut surface 24 is formed on the film on the rear side of the semiconductor wafer 1 (a negative side of the Z axis). The inner wall 25 of the void 6 is exposed between the cut surfaces 23 and 24.

Thus, according to the first embodiment, it is possible to provide the semiconductor chip 9 with the lateral surface partially (in this example, the device layer 11) covered with the film of the material of the dicing boundary structure 5.

In the case of the columnar dicing boundary structure 5 as illustrated in FIG. 4C, of the lateral surface of the semiconductor chip 9, the part with the dicing boundary structure 5 removed is covered with the film of the material of the dicing boundary structure 5 after dicing.

Figure 8:
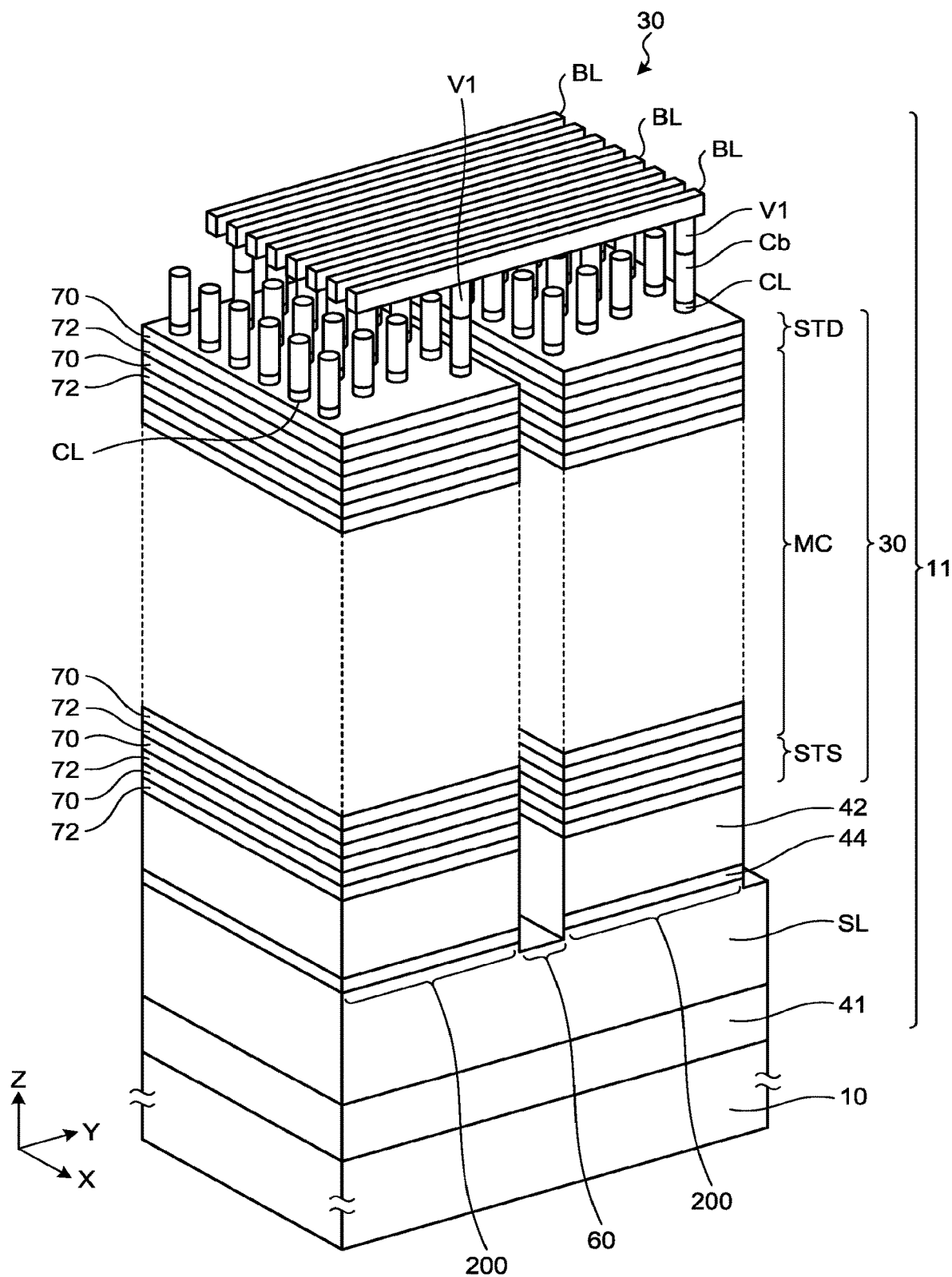
FIG. 8 is a schematic perspective view of an exemplary integrated circuit according to the first embodiment.
Figure 9:
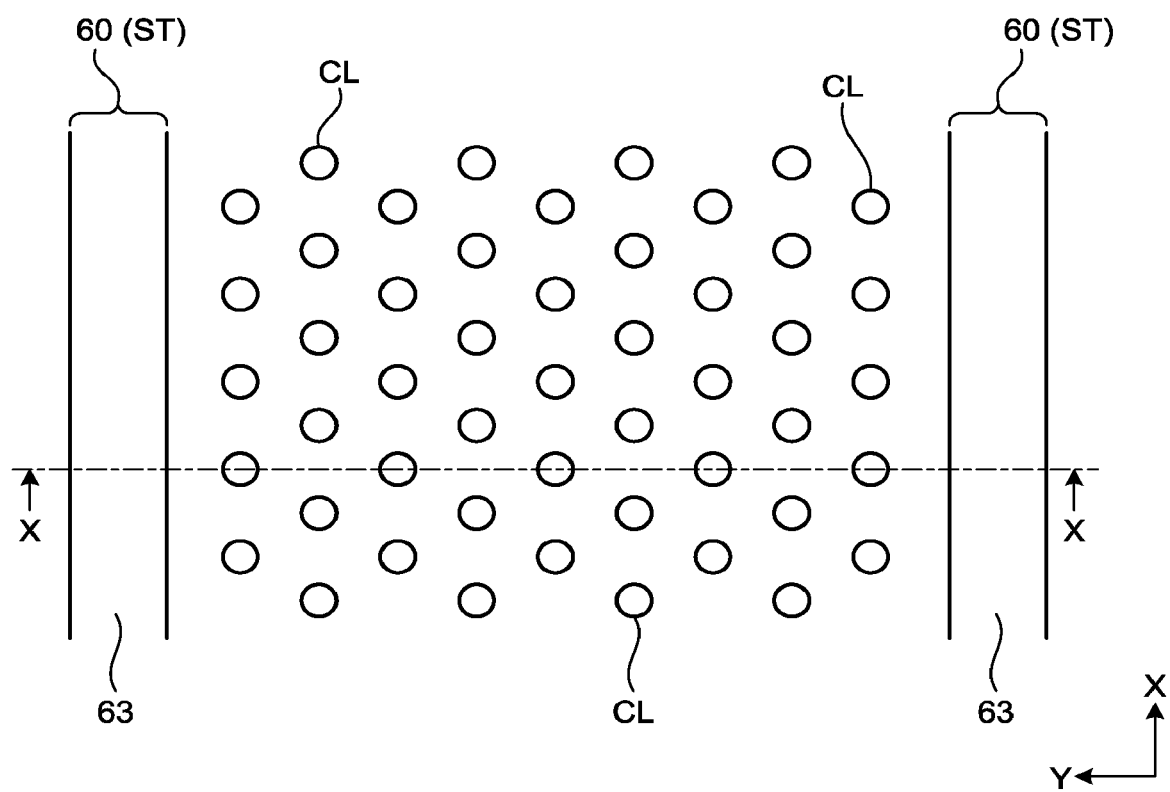
FIG. 9 is a schematic plan view of the integrated circuit according to the first embodiment.
Figure 10:
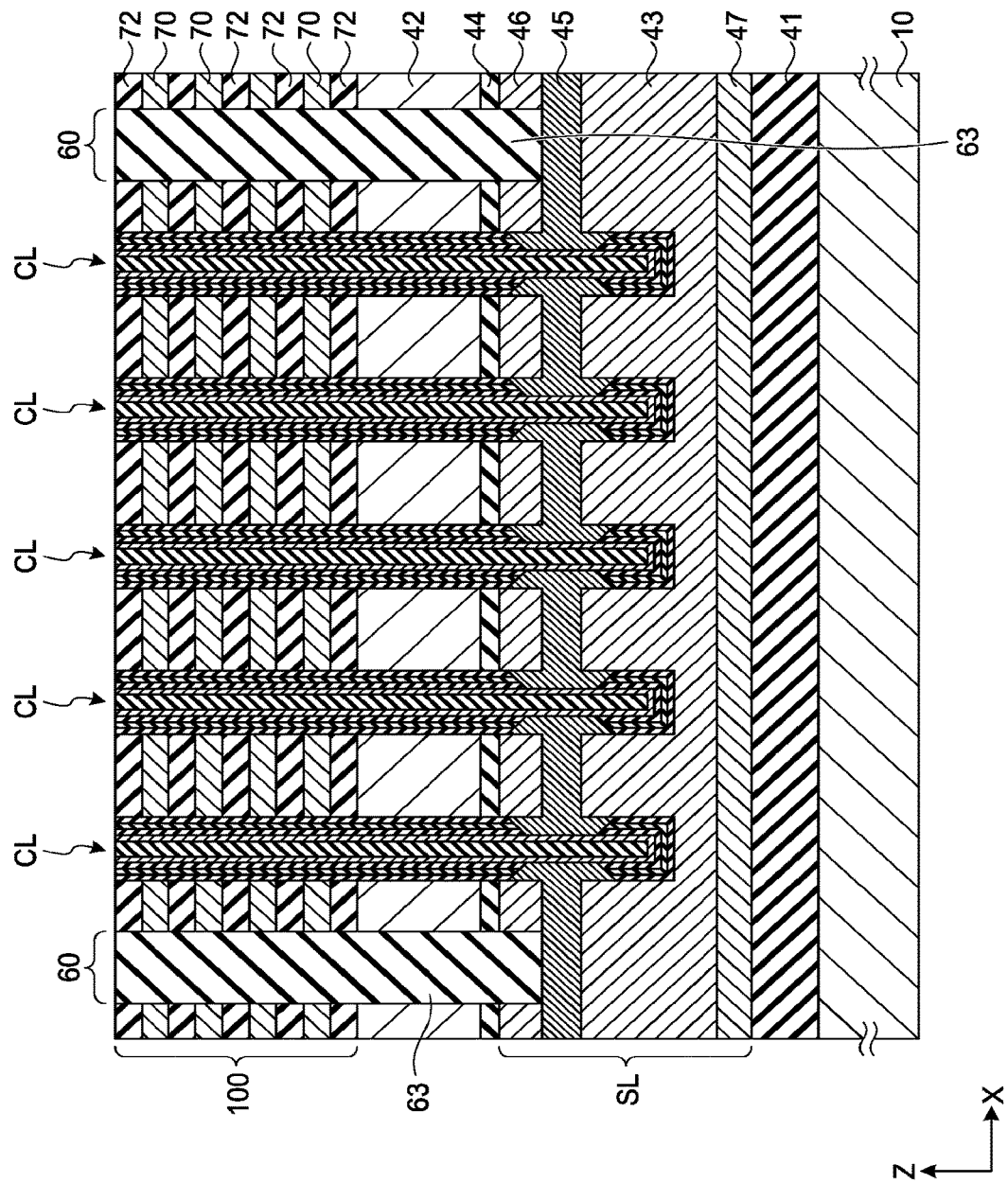
FIG. 10 is a schematic sectional view of the integrated circuit of FIG. 9 taken along a section line X-X.

In each of the chip regions 2, an integrated circuit is formed on or in the device layer 11. With reference to FIG. 8 to FIG. 10, an exemplary integrated circuit formed in the device layer 11 will be described. The integrated circuit is a three-dimensional NAND flash memory cell array as an example. The integrated circuit formed in each chip region 2 is not limited thereto.

FIG. 8 is a schematic perspective view of the integrated circuit according to the first embodiment. FIG. 9 is a schematic plan view of the integrated circuit according to the first embodiment. FIG. 10 is a schematic sectional view of the integrated circuit of FIG. 9 taken along a section line X-X.

The memory cell array includes a source layer SL, a multilayer element 30 formed on the source layer SL, a plurality of columns CL, a plurality of separators 60, and a plurality of bit lines BL arranged above the multilayer element 30.

The source layer SL is located on the silicon substrate 10 through an insulating layer 41. A gate layer 42 lies between the source layer SL and the multilayer element 30.

The columns CL are substantially cylindrical, extending through the multilayer element 30 in the layered direction or Z direction. The columns CL reaches the source layer SL through the gate layer 42 below the multilayer element 30. The columns CL are, for example, arranged in zigzag. Alternatively, the columns CL may be arranged in square lattice in an X direction and a Y-axis direction.

The separators 60 serve to divide the multilayer element 30 and the gate layer 42 into a plurality of blocks or fingers in the Y direction. The separators 60 are each formed by filling a slit ST with an insulating film 63.

The bit lines BL are, for example, metal films extending in the Y direction. The bit lines BL are spaced apart from each other in the X direction.

The top ends of the columns CL are connected to the bit lines BL through contacts Cb and contacts V1 as illustrated in FIG. 8.

As illustrated in FIG. 10, the source layer SL includes a metal-containing layer 47, and semiconductor layers 43, 45, and 46.

The metal-containing layer 47 is located on the insulating layer 41. The metal-containing layer 47 is, for example, a tungsten layer or a tungsten silicide layer.

The semiconductor layer 43 is located on the metal-containing layer 47, the semiconductor layer 45 is located on the semiconductor layer 43, and the semiconductor layer 46 is located on the semiconductor layer 45.

The semiconductor layers 43, 45, and 46 are conductive, polycrystal silicon layers containing a dopant. The semiconductor layers 43, 45, and 46 can be, for example, polycrystal silicon layers doped with phosphorus.

The insulating layer 44 is located on the semiconductor layer 46, and the gate layer 42 is located on the insulating layer 44. The gate layer 42 is a conductive, polycrystal silicon layer containing a dopant. The gate layer 42 can be, for example, a polycrystal silicon layer doped with phosphorus.

The multilayer element 30 is located on the gate layer 42. The multilayer element 30 includes a plurality of electrode layers 70 laminated in a direction (Z direction) perpendicular to the principal surface of the silicon substrate 10. An insulating layer, i.e., an insulant 72 lies between every vertically adjacent electrode layers 70. The insulating layer 72 is also placed between the lowermost electrode layer 70 and the gate layer 42.

The electrode layers 70 are metal layers. The electrode layer 70 are, for example, tungsten layers containing tungsten as a chief component or molybdenum layers containing molybdenum as a chief component. The insulating layer 72 is a silicon oxide layer containing silicon oxide as a main component.

Among the electrode layers 70, at least the uppermost electrode layer 70 serves as the control gate of a drain-side selection transistor STD (refer to FIG. 8). At least the lowermost electrode layer 70 serves as the control gate of a source-side selection transistor STS (refer to FIG. 8). For example, the lower electrode layers 70 including the lowermost electrode layer 70 serve as source-side select gates. A plurality of drain-side select gates may be provided.

The electrode layers 70 between the drain-side select gates and the source-side select gates serve as cell gates.

The gate layer 42 is greater in thickness than one electrode layer 70 and one insulating layer 72.

The columns CL extend through the multilayer element 30 in the layered direction, and reach the semiconductor layer 43 through the gate layer 42, the insulating layer 44, the semiconductor layer 46, and the semiconductor layer 45.

Such an integrated circuit includes structures, such as the columns CL or the separators 60, extending through the device layer 11 along the thickness. The columns CL and the separators 60 extending through the device layer 11 along the thickness may serve as a second structure according to the embodiment.

The second structure is generally formed by lamination of the multilayer element 30, etching cavities in the multilayer element 30, and filling the cavities with a given filling material by deposition.

The dicing boundary structure 5 of the first embodiment can be formed in the same manner as the second structure. For example, in the etching process, the cavities are simultaneously formed for the second structure and the dicing boundary structure 5. In the deposition process, the filling material is deposited simultaneously in the cavities to become the second structure and the dicing boundary structure 5.

FIGS. 11A to 11D are schematic views illustrating an exemplary formation of the dicing boundary structure 5 of the first embodiment. In the drawings, the separators 60 and the dicing boundary structure 5 are formed through the same process. That is, in the example of FIGS. 11A to 11D, the separators 60 correspond to the second structure, and the slits ST correspond to cavities (cavities 81) in which the separators 60 are formed.

Figure 11A:
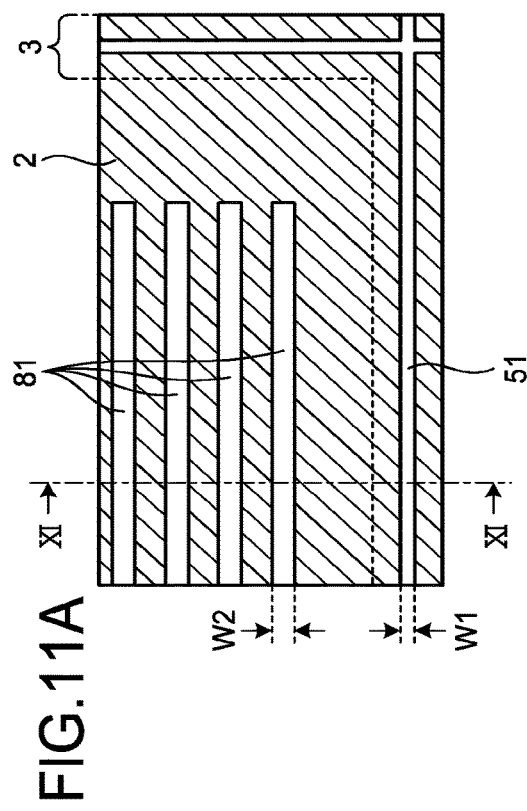
FIGS. 11A to 11D are schematic views illustrating an example of forming the dicing boundary structure in the first embodiment.
Figure 11D:
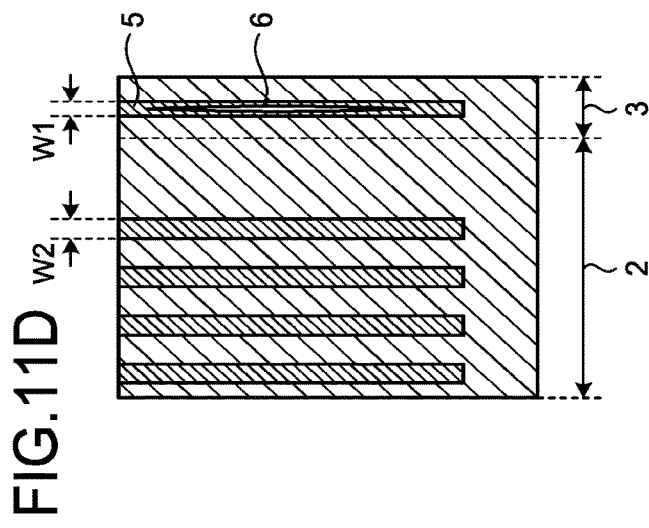

After lamination of the multilayer element 30, the semiconductor wafer 1 is subjected to etching to simultaneously form the cavities 81 (that is, slits ST) and the cavity 51 for the dicing boundary structure 5. FIG. 11A is a plan view of a partial region of the surface of the semiconductor wafer 1 with the cavities 81 and the cavity 51 formed. FIG. 11B is a sectional view of the semiconductor wafer 1 of FIG. 11A taken along a section line XI-XI.

The opening size of the cavities 81, specifically, a width W2 is set to prevent occurrence of a void on the slits ST during deposition of the filling material. In contrast, the opening size of the cavity 51, specifically, a width W1 is set to cause the void 6 in the dicing boundary structure 5. That is, the opening sizes of the cavities 81 and the cavity 51 are different in terms of width.

In the example of FIGS. 11A to 11D, the opening width W1 of the cavity 51 is narrower than the opening width W2 of the cavities 81. The magnitude relationship between the widths W1 and W2 is not limited thereto. The magnitude relationship between widths W1 and W2 can be reversed in accordance with various conditions for depositing a filling material 90.

Subsequently, in the deposition process, for example, the material of the insulating film 63 as the filling material 90 is deposited on the semiconductor wafer 1 with the cavities 81 and the cavity 51 by chemical vapor deposition or sputtering.

In the example of FIGS. 11A to 11D, due to the narrower opening width W1 of the cavity 51 than the opening width W2 of the slits ST, the opening of the cavity 51 is closed by the deposited filling material 90 before completely filling the cavity 51 with the filling material 90. This results in creating the void 6 in the cavity 51.

Figure 11C:
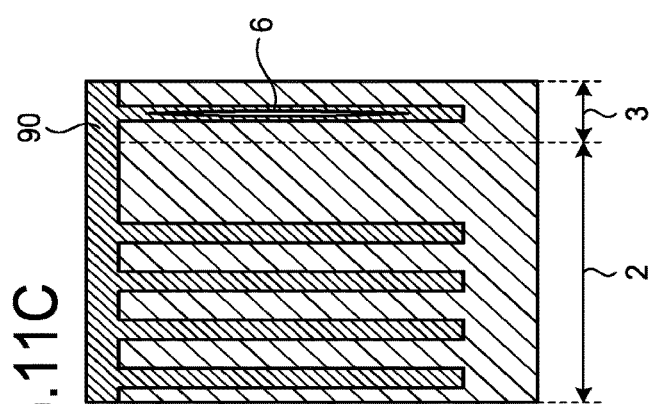
Figure 11B:
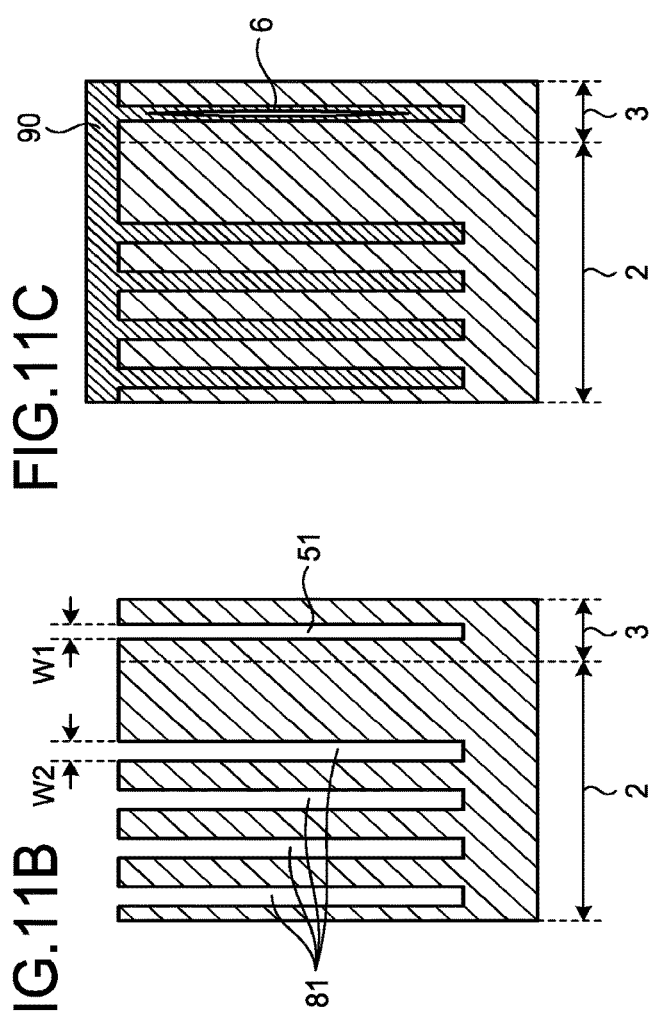

Through the deposition process, as illustrated in FIG. 11C, the filling material 90 is deposited on the surface of the semiconductor wafer 1. The slits ST are filled with the filling material 90. The cavity 51 is not completely filled with the filling material 90 but has the void 6 inside.

Then, the film of the filling material 90 is removed from the surface of the semiconductor wafer 1 by, for example, chemical mechanical polishing (CMP). Thereby, the semiconductor wafer 1 has the slits ST and the dicing boundary structure 5 formed, as illustrated in FIG. 11D.

As described above, the dicing boundary structure 5 and the separators 60 are formed through the same process that is, etching and deposition. This makes it possible to form the dicing boundary structure 5 without an additional dedicated process.

The second structure is not limited to the separators 60. The second structure may be the columns CL.

Figure 12A:
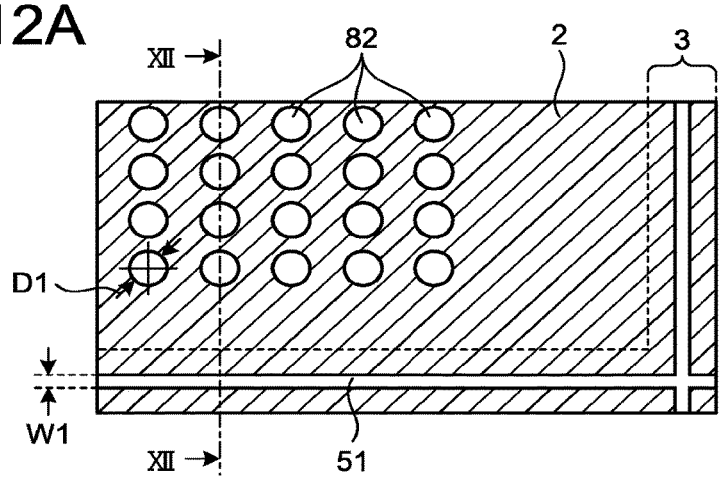
FIGS. 12A to 12C are schematic views illustrating another example of forming the dicing boundary structure in the first embodiment.
Figure 12B:
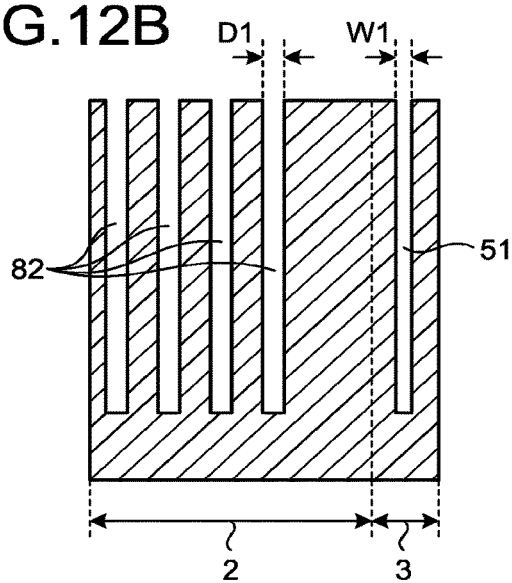
Figure 12C:
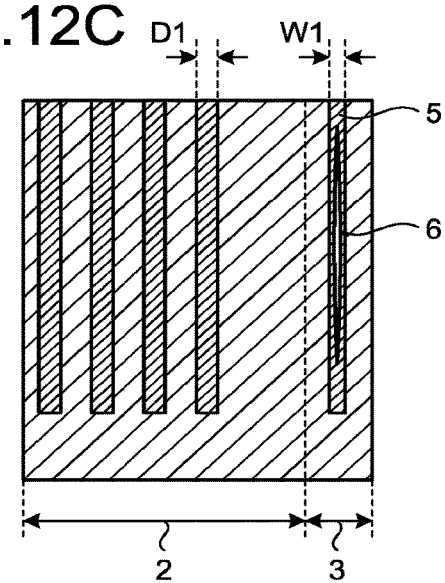

FIGS. 12A to 12C are schematic views illustrating another example of formation of the dicing boundary structure 5 of the first embodiment.

Through the etching process, for example, cavities 82 and the cavity 51 are simultaneously formed for the columns CL and the dicing boundary structure 5. FIG. 12A is a plan view of a partial region of the front surface of the semiconductor wafer 1 with the cavity 82 and the cavity 51 formed. FIG. 12B is a sectional view of the semiconductor wafer 1 of FIG. 12A taken along a section line XII-XII.

The opening size of the columns CL, specifically, a diameter D1 is set so as not to cause a void in the columns CL during deposition of the filling material. In contrast, the opening size of the cavity 51, specifically, a width W1 is set so as to cause the void 6 in the dicing boundary structure 5.

Subsequently, through the deposition process, for example, the filling material is deposited by chemical vapor deposition or sputtering on the semiconductor wafer 1 with the cavities 82 and the cavity 51. Then, the film of the filling material is removed from the surface of the semiconductor wafer 1. Thus, the semiconductor wafer 1 has the columns CL and the dicing boundary structure 5 formed, as illustrated in FIG. 12C. The columns CL illustrated in FIG. 12C may undergo the etching process and the deposition process again to be further filled with another material to extend in the axial direction of the columns CL.

As described above, the dicing boundary structure 5 and the columns CL can be formed through the same processes that is, etching process and deposition process.

Figure 13A:
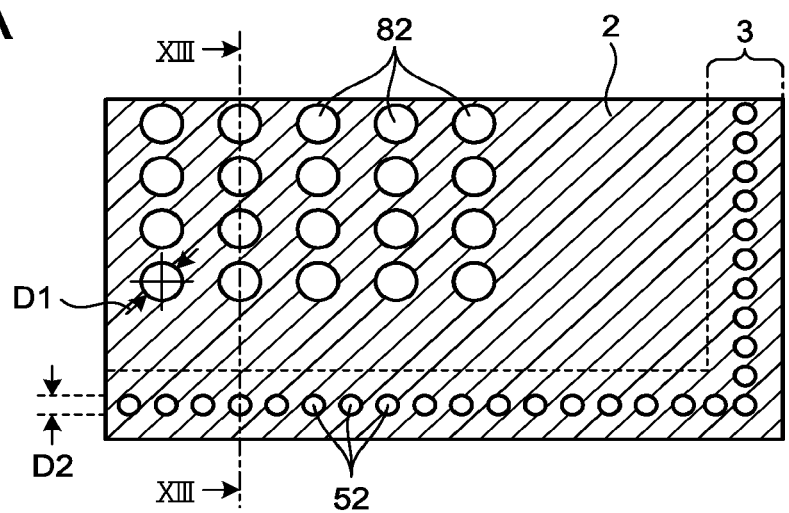
FIGS. 13A and 13B are schematic views illustrating an example of forming a columnar dicing boundary structure in the first embodiment.
Figure 13B:
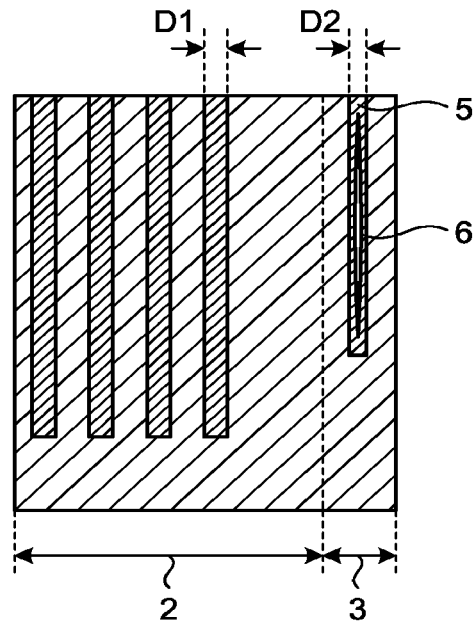

FIGS. 13A and 13B are schematic views illustrating an exemplary formation of the dicing boundary structure 5 of a columnar shape in the first embodiment.

Through the etching process, for example, the cavities 82 and cavities 52 are simultaneously formed for the columns CL and for the dicing boundary structure 5, respectively. The opening size of the cavities 82, specifically, a diameter D1 is set so as not to cause a void in the columns CL. In contrast, the opening size of the cavities 52, specifically, a diameter D2 is set so as to cause the void 6 in the dicing boundary structure 5.

In the example of FIGS. 13A and 13B, the opening diameter D2 of the cavities 52 is set to less than the opening diameter D1 of the cavities 82. Because of this, the opening of the cavities 52 is closed by the deposited filling material before the cavities 52 are filled with the filling material. Thereby, the cavities 52 have the void 6 formed inside. The magnitude relationship between D1 and D2 can be reversed in accordance with various conditions for depositing the filling material.

FIG. 13B illustrates the semiconductor wafer 1 after the removal of the deposited filling material film from the surface of the semiconductor wafer 1. As illustrated in this drawing, the columns CL with no void and the dicing boundary structure 5 having the void 6 are created.

Thus, to create a void in the dicing boundary structure 5 and not to create a void in the second structure, the cavities for the dicing boundary structure 5 differ in opening size from the cavities for the second structure.

That is, in the first embodiment the dicing boundary structure 5 and the second structure constituting the integrated circuit (for example, the separators 60 or the columns CL) can be simultaneously formed.

The depths of the cavities 51 and 52 can be controlled by any method.

FIGS. 14A to 14C are schematic views illustrating different depth control methods of the cavities according to the first embodiment.

As illustrated in FIG. 14A, for example, in the lamination process a first stopper film 91 is formed in the kerf region 3, and a second stopper film 92 is formed in the chip region 2. The stopper films 91 and 92 are both made from a material serving to hinder the progress of etching. In the etching process, the first stopper film 91 works to stop the progress of etching with respect to the cavities 51 and 52 for the dicing boundary structure 5. The second stopper film 92 works to stop the progress of etching with respect to the cavities 81 and 82 for the second structure. This facilitates depth control over the cavities.

In another example, as illustrated in FIG. 14B, a third stopper film 93 is formed in common in the chip region 2 and the kerf region 3 in the lamination process. Etch rate depends on the thickness (width or diameter) and density of the opening. The influence of the opening thickness on the etch rate is known as a micro-loading effect. The influence of the opening density on the etch rate is known as a loading effect.

To etch the cavities 81 and 82 for the second structure at a higher speed than the cavities 51 and 52 for the dicing boundary structure 5 and to form the cavities 51 and 52 in thinner thickness than the cavities 81 and 82, the third stopper film 93 serves to stop the progress of the etching to the cavities 81 and 82 for the second structure. That is, during etching, etching end timing is controlled while the depth of the cavities 51 and 52 for the dicing boundary structure 5 is monitored.

In still another example, as illustrated in FIG. 14C, a fourth stopper film 94 is formed in the chip region 2 in the lamination process. No stopper film is formed in the kerf region 3. In the etching process, the depth of the cavities 51 and 52 for the dicing boundary structure 5 is monitored, and etching is ended when the cavities 51 and 52 reach a desired depth. In the example of FIG. 14C, etching is ended when the depth of the cavities 51 and 52 reaches the silicon substrate 10. Thereby, the dicing boundary structure 5 reaches the silicon substrate 10.

According to the first embodiment as described above, the semiconductor wafer 1 includes the plurality of chip regions 2, the kerf region 3 located between the chip regions 2, and the dicing boundary structure 5 located in the kerf region 3 as the first structure extending through the device layer 11 in the thickness direction.

Thus, in the dicing process, it is possible to separate the individual semiconductor chips 9 from the semiconductor wafer 1 without machining the scribe lines with blades. That is, the semiconductor chips 9 can be readily separated individually from the semiconductor wafer 1.

In addition, the dicing boundary structure 5 is formed by deposing the filling material in the cavities 51 and 52 in the device layer, and has the void 6.

This can avoid occurrence of unintended cut or fracture at the time of back grinding and facilitate dicing.

In addition, the integrated circuit located in each of the chip regions 2 includes the second structure extending through the device layer along the thickness. The second structure contains the same material as the filling material of the dicing boundary structure 5.

Thus, the dicing boundary structure 5 and the second structure can be formed through the same process.

In addition, the cavities 51 and 52 are different in opening size from the cavities 81 and 82 in which the second structure is formed.

Thereby, it is possible to create the void 6 in the dicing boundary structure 5 and avoid occurrence of void in the second structure through the same forming process.

The cavities 51 and 52, and the cavities 81 and 82 to become the second structure are formed through the same etching process. The cavities 51 and 52, and the cavities 81 and 82 to become the second structure are simultaneously formed by etching, for example.

This can shorten the total time taken for fabricating the semiconductor wafer 1, as compared with forming the cavities 51 and 52 and the cavities 81 and 82 to become the second structure through different etching processes.

In addition, the cavities 51 and 52 and the cavities 81 and 82 are formed in the same etching process, and then the filling material is deposited in the cavities 51 and 52 and the cavities 81 and 82 through the same deposition process.

This can shorten the total time taken for fabricating the semiconductor wafer 1, compared with the deposition of the filling material in the cavities 51 and 52 and the cavities 81 and 82 through different deposition processes.

According to the first embodiment, a film is attached to the semiconductor chip 9 separated from the semiconductor wafer 1, covering at least part of the lateral surface thereof. The film is formed of the filling material described above.

In the case of the separators 60 serving as the second structure, for example, the film is formed of the same material as the second structure, that is, the material of the insulating film 63.

Second Embodiment

A second embodiment will describe another example of the first structure. The first structure of the second embodiment will be referred to as a dicing boundary structure 5a.

Figure 15:
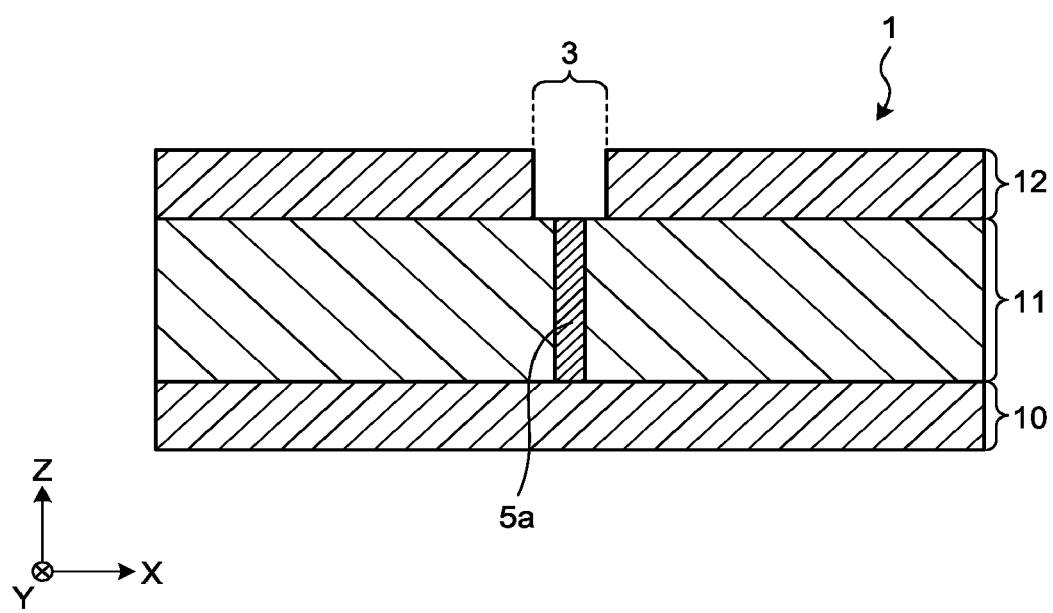
FIG. 15 is a view illustrating an exemplary form of a dicing boundary structure according to a second embodiment.

FIG. 15 is a view illustrating an exemplary form of the dicing boundary structure 5a of the second embodiment. FIG. 15 is a sectional view of the semiconductor wafer 1 taken along the same section line as that in FIG. 3.

In the second embodiment, as with the dicing boundary structure 5 of the first embodiment, the dicing boundary structure 5a has a shape extending through the device layer 11 along the thickness of the semiconductor wafer 1. The dicing boundary structure 5a is, for example, formed of a porous material. The material of the dicing boundary structure 5a may be any material other than a porous material as long as it is likely to cause brittle fracture. Alternatively, as illustrated in FIGS. 6A to 6C, since the dicing boundary structure 5a is to break when applied with a tensile force, the dicing boundary structure 5a may have a tensile stress-to-break smaller than the rest.

The cavity for the dicing boundary structure 5a and the cavities 81 and 82 for the second structure are, for example, formed through the same process.

FIGS. 16A to 16E are schematic views illustrating an exemplary formation of the dicing boundary structure 5a of the second embodiment. FIGS. 16A to 16E illustrate an example that the separator 60 and the dicing boundary structure 5a are formed through the same process. That is, in the example of FIGS. 16A to 16E, the separators 60 serve as the second structure, and the slits ST correspond to the cavities for forming the separators 60 (cavities 81).

After formation of the multilayer element 30 through the lamination process, the cavities 81, i.e., the slits ST and the cavity 51 for the dicing boundary structure 5a are simultaneously formed through the etching process. The opening size of the cavity 51, specifically, a width W3 is set to greater than the opening size of the cavity 81, specifically, a width W2.

Then, the filling material 90 is deposited through the deposition process, as illustrated in FIG. 16B. The filling material 90 is, for example, the material of the insulating film 63. The cavities 81 are filled with the filling material 90 and closed. In contrast, the cavity 51 is not closed by the filling material 90 due to a larger opening size. A cavity 53 is formed inside the cavity 51 by depositing the filling material 90 on the inner wall of the cavity 51.

Subsequently, the semiconductor wafer 1 has the slits ST and the cavity 53 formed, as illustrated in FIG. 16C, by removing the film of the filling material 90 from the surface of the semiconductor wafer 1 by CMP, for example.

Then, a porous filling material 95 is deposited on the semiconductor wafer 1 with the slits ST and the cavity 53. Thereby, the cavity 53 is filled with the filling material 95, as illustrated in FIG. 16D.

By removing the film of the filling material 95 from the surface of the semiconductor wafer 1 by CMP, for example, a structure with the cavity, for the dicing boundary structure 5a, filled with the porous material can be produced, as illustrated in FIG. 16E.

The dicing boundary structure 5a contains the porous filling material 95. The porous filling material 95 is more likely to cause brittle fracture than the filling material 90 in direct contact with the filling material 95, and the rest of the device layer. Thus, the position of the dicing boundary structure 5a is more fragile than the rest of the semiconductor wafer 1. Because of this, applied with the stress in the direction indicated by the arrow 7 or 8 in FIGS. 4A to 4C, the semiconductor wafer 1 is cut at the positions of the dicing boundary structure 5a, as with the first embodiment.

In addition, the dicing boundary structure 5a is formed by filling the cavity with the porous material, so that the position of the dicing boundary structure 5a is not as fragile as the one with a simple cavity such as a groove. That is, unlike the comparative example, the dicing boundary structure 5a can be avoided from being unintentionally cut or torn at the time of back grinding, for example.

Figure 17A:
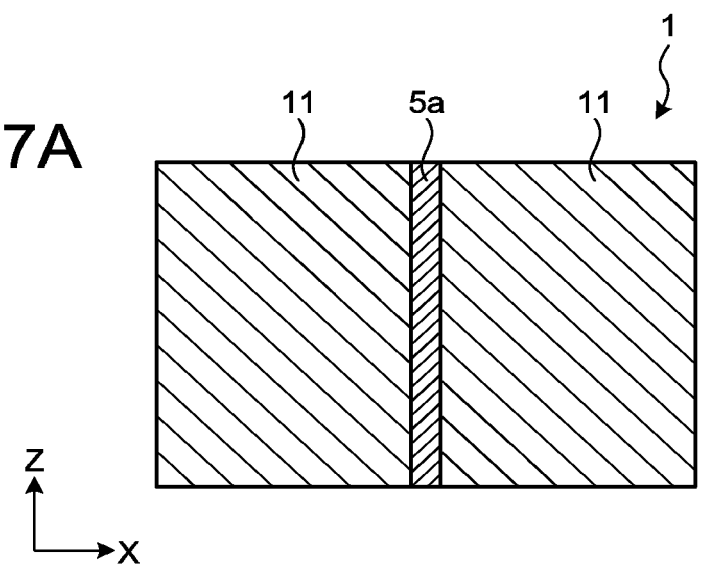
FIGS. 17A to 17C are schematic views illustrating an exemplary state of the lateral surface of a semiconductor chip produced by dicing in the second embodiment.
Figure 17B:
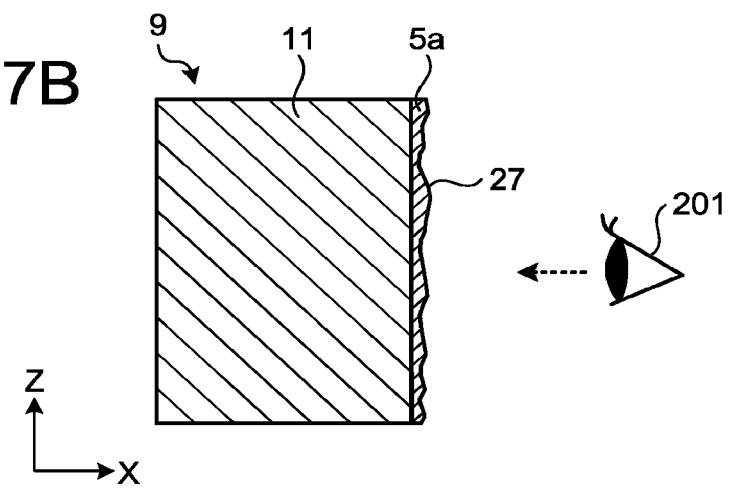
Figure 17C:
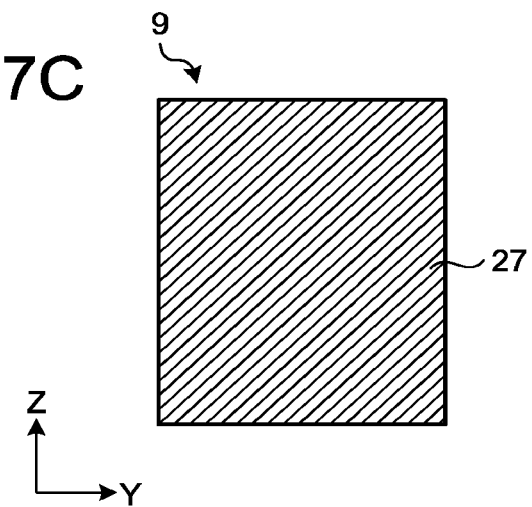

FIGS. 17A to 17C are schematic views illustrating an exemplary state of the lateral surface of the semiconductor chip 9 produced by dicing in the second embodiment.

FIG. 17A illustrates the dicing boundary structure 5a before dicing. FIG. 17B illustrates the semiconductor chip 9 produced by dicing the semiconductor wafer 1. As illustrated in FIG. 17B, a cut surface 27 of the dicing boundary structure 5a is exposed in the surface created by dicing the semiconductor wafer 1, that is, the lateral surface of the semiconductor chip 9. FIG. 17C illustrates the cut surface 27 of the dicing boundary structure 5a as seen from an observing point 201. In the example of FIG. 17C, the lateral surface of the device layer 11 is covered with the film of the porous material of the dicing boundary structure 5a.

Thus, the first structure may be formed of a porous material, as with the dicing boundary structure 5a. As described above, the dicing boundary structure 5a can be formed of an optional material other than a porous material as long as the material is likely to cause brittle fracture.

The dicing boundary structure 5a may be in the form of a wall or a column.

Third Embodiment

A third embodiment will describe still another example of the first structure. The first structure of the third embodiment will be referred to as a dicing boundary structure 5b.

Figure 18:
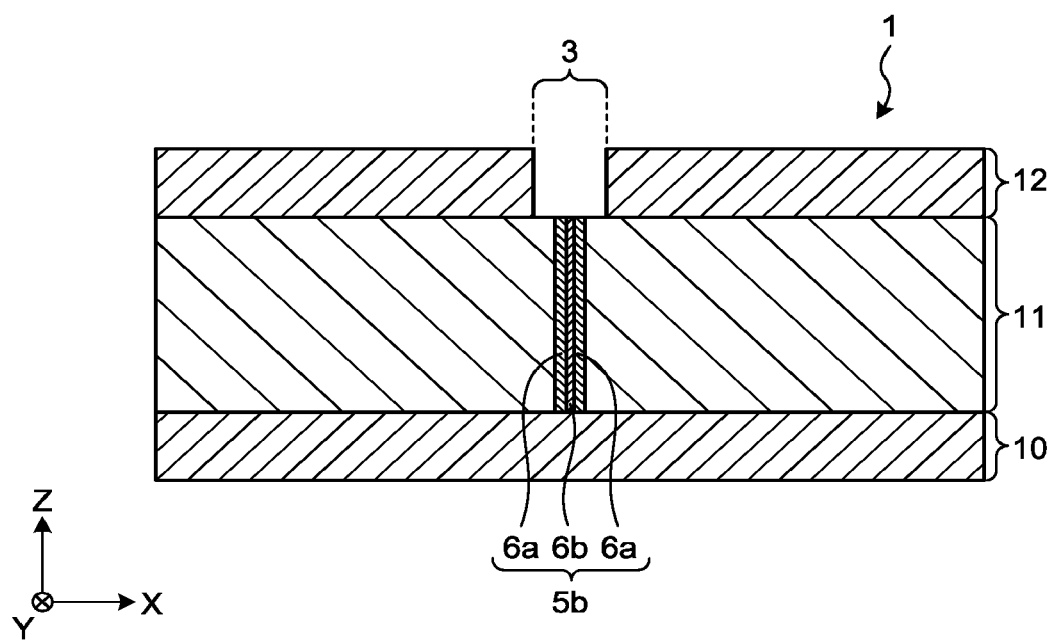
FIG. 18 is a view illustrating an exemplary form of a dicing boundary structure according to a third embodiment.

FIG. 18 is a view illustrating an exemplary form of the dicing boundary structure 5b of the third embodiment. FIG. 18 is a sectional view of the semiconductor wafer 1 taken along the same section line as that in FIG. 3.

As with the dicing boundary structure 5 of the first embodiment, the dicing boundary structure 5b of the third embodiment has a shape extending through the device layer 11 along the thickness of the semiconductor wafer 1. That is, the cavity for the dicing boundary structure 5b and the cavity for the second structure can be simultaneously formed by etching.

The dicing boundary structure 5b of a wall form includes a lamination of a first peeling layer 6a as a first film and a second peeling layer 6b as a second film along the thickness. A total of three peeling layers 6a and 6b are laminated such that one second peeling layer 6b is interposed between two first peeling layers 6a.

The materials of the first peeling layers 6a and the second peeling layer 6b are set to exert a certain degree or less of adhesiveness between the first peeling layer 6a and the second peeling layer 6b. Alternatively, the first peeling layer 6a and the second peeling layer 6b may exhibit smaller adhesiveness than the first peeling layer 6a and a film in direct contact with the first peeling layer 6a outside the first peeling layer 6a and the cavity. The first peeling layer 6a and the second peeling layer 6b may exhibit smaller adhesiveness than the second peeling layer 6b and a film in direct contact with the second peeling layer 6b outside the second peeling layer 6b and the cavity. The first peeling layer 6a or the second peeling layer 6b alone may be formed in the cavity. In this case, the first peeling layer or the second peeling layer is in direct contact with a film outside the first peeling layer 6a or the second peeling layer 6b and the cavity and they exhibit a certain degree or less of adhesiveness.

For example, one of the first peeling layer 6a and the second peeling layer 6b is formed of WSi, W, SiN, SiCN, or a-Si while the other is formed of $SiO_2$. TEOS-$SiO_2$ may be adopted as $SiO_2$. The columns CL are also made of such materials. That is, the columns CL and the lamination of the first peeling layer 6a and the second peeling layer 6b can be simultaneously formed. The first peeling layer 6a and the second peeling layer 6b can be each made of any of the materials described above or materials other than the above materials. The first peeling layer 6a and/or the second peeling layer 6b may be formed of a material different from the material of the integrated circuit.

Owing to the wall-like dicing boundary structure 5b including the laminated peeling layers along the thickness with the certain degree or less of adhesiveness, the position of the dicing boundary structure 5b is more fragile with respect to the stress in the direction indicated by the arrow 7 or 8 in FIGS. 4A to 4C than the rest. Thus, by applying the stress in the direction indicated by the arrow 7 or 8 to the semiconductor wafer 1, the semiconductor wafer 1 is cut at the position of the dicing boundary structure 5*b*.

In addition, the dicing boundary structure 5*b* includes the laminated peeling layers so that the position of the dicing boundary structure 5*b* is not as fragile as the one with a simple cavity such as a groove. Thus, unlike the comparative example, the dicing boundary structure 5*b* can be prevented from being unintentionally cut at the time of back grinding, for example.

FIGS. 19A to 19E are schematic views illustrating an exemplary state of the lateral surface of the semiconductor chip 9 produced by dicing in the third embodiment.

Figure 19A:
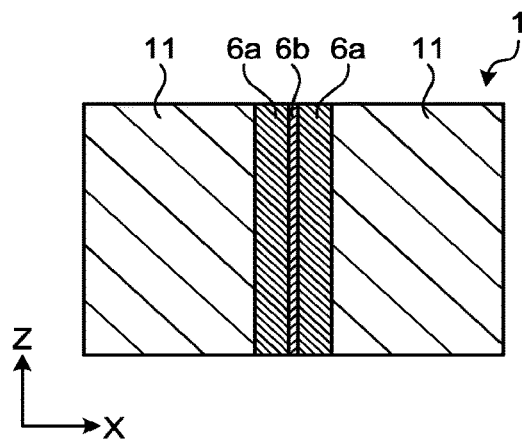
FIGS. 19A to 19E are schematic views illustrating an exemplary state of the lateral surface of a semiconductor chip produced by dicing in the third embodiment.
Figure 19D:
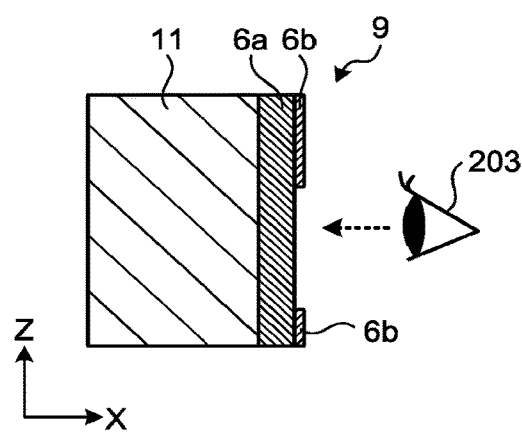
Figure 19B:
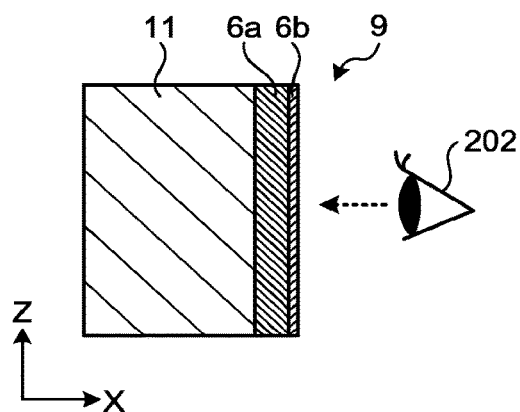
Figure 19E:
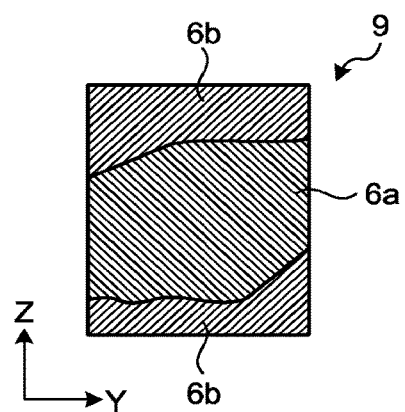
Figure 19C:
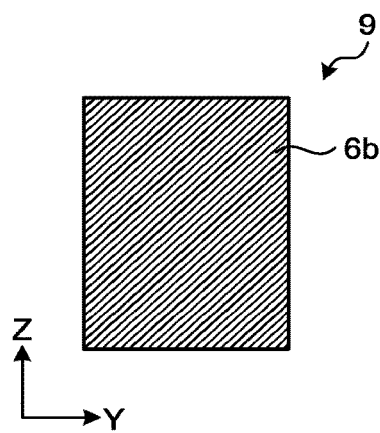

FIG. 19A illustrates the dicing boundary structure 5*b* before dicing. FIG. 19B illustrates the semiconductor chip 9 produced by dicing the semiconductor wafer 1. FIG. 19C illustrate a cut surface of the dicing boundary structure 5*b* due to dicing, as seen from an observing point 202.

In the example of FIGS. 19B and 19C, the second peeling layer 6*b*, of the two peeling layers 6*a* and 6*b* of the dicing boundary structure 5*b*, is exposed in the lateral surface of the semiconductor chip 9. Although not illustrated in FIGS. 19B and 19C, the first peeling layer 6*a* is exposed to the lateral surface of another semiconductor chip 9 produced by dicing.

For example, one of the first peeling layer 6*a* and the second peeling layer 6*b* is formed of WSi, W, SiN, SiCN, or a-Si while the other is formed of SiO$_2$. In such a case two or more semiconductor chips 9, including the semiconductor chip 9 whose lateral surface is at least partially covered with a WSi, W, SiN, SiCN, or a-Si film, are produced by dicing.

The second peeling layer 6*b* between two first peeling layers 6*a* may be damaged by dicing. FIG. 19D illustrates the semiconductor chip 9 including a broken second peeling layer 6*b*, produced by dicing the semiconductor wafer 1. FIG. 19D illustrates the lateral surface of the semiconductor chip 9 of FIG. 19E, as seen from an observing point 203. In the example of FIGS. 19D and 19E, the second peeling layer 6*b*, of the two peeling layers 6*a* and 6*b* of the dicing boundary structure 5*b*, is exposed on part of the lateral surface of the semiconductor chip 9, and the first peeling layer 6*a* is exposed on the rest thereof.

That is, as with the dicing boundary structure 5*b*, the first structure may have a wall shape and include a lamination of the first peeling layer 6*a* and the second peeling layer 6*b* along the thickness.

The first to third embodiments can be combined appropriately. For example, the filling material 90 of the first embodiment may include the porous filling material 95 of the second embodiment or the peeling layers 6*a* and 6*b* of the third embodiment.

In addition, in the first embodiment to the third embodiment, the device layer 11 after dicing includes, on the lateral surface, a film having a composition different from a film slightly further inside the device layer 11. Alternatively, in cross section, the films are discontinuous on the lateral surface, when exposed.

While certain embodiments have been described, these embodiments have been presented by way of example only, and are not intended to limit the scope of the inventions. Indeed, the novel methods and systems described herein may be embodied in different other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor wafer in which a plurality of chip regions is formed, the semiconductor wafer comprising:
   a device layer including an integrated circuit formed in each of the plurality of chip regions;
   a first structure formed in a kerf region by filling a first cavity with a first filling material, the first cavity extending vertically with respect to a surface of a semiconductor substrate; and
   a second structure formed in the device layer by filling a second cavity with a second filling material, the second cavity extending vertically with respect to the surface of the semiconductor substrate, wherein
   the first filling material includes a void inside.

2. The semiconductor wafer according to claim 1, wherein the first filling material is smaller in tensile stress to break than a film in direct contact with the first filling material.

3. The semiconductor wafer according to claim 1, wherein the first filling material and a film in direct contact with the first filling material exhibit a given degree or less of adhesiveness.

4. The semiconductor wafer according to claim 3, wherein the first filling material includes at least two layers laminated along the surface of the semiconductor wafer, the at least two layers extending toward a direction perpendicular to the surface of the semiconductor wafer, the at least two layers including a first film and a second film, and
   the first film and the second film exhibit smaller adhesiveness than the first film and the film in direct contact with the first film outside the first cavity.

5. The semiconductor wafer according to claim 4, wherein the first film is formed of one of WSi, W, SiN, SiCN, and a-Si, and
   the second film is formed of SiO$_2$.

6. The semiconductor wafer according to claim 1, wherein the first cavity and the second cavity are formed through a same process.

7. The semiconductor wafer according to claim 1, wherein the first structure is in the form of a wall.

8. The semiconductor wafer according to claim 1, wherein the first structure includes a plurality of columns.

9. The semiconductor wafer according to claim 1, wherein in a direction perpendicular to the surface of the semiconductor substrate, the first structure is shorter in length than the second structure.

10. The semiconductor wafer according to claim 1, wherein
    the integrated circuit comprises
    a multilayer element, and
    a separator of a wall form that extends through the multilayer element in a thickness direction, and
    the second structure serves as the separator.

11. The semiconductor wafer according to claim 1, wherein
    the integrated circuit comprises
    a multilayer element, and
    a plurality of columns that extends through the multilayer element in a thickness direction and includes a laminated structure of a semiconductor layer and an insulating layer, and
    the second structure serves as the columns.

12. The semiconductor wafer according to claim 1, wherein the first filling material and the second filling material have a same composition.

13. A semiconductor wafer in which a plurality of chip regions is formed, the semiconductor wafer comprising:
a device layer including an integrated circuit formed in each of the plurality of chip regions;
a first structure formed in a kerf region by filling a first cavity with a first filling material, the first cavity extending vertically with respect to a surface of a semiconductor substrate; and
a second structure formed in the device layer by filling a second cavity with a second filling material, the second cavity extending vertically with respect to the surface of the semiconductor substrate, wherein
the first cavity is different in opening width from the second cavity.

14. The semiconductor wafer according to claim 13, wherein
the integrated circuit comprises
a multilayer element, and
a separator of a wall form that extends through the multilayer element in a thickness direction, and
the second structure serves as the separator.

15. The semiconductor wafer according to claim 13, wherein
the integrated circuit comprises
a multilayer element, and
a plurality of columns that extends through the multilayer element in a thickness direction and includes a laminated structure of a semiconductor layer and an insulating layer, and
the second structure serves as the columns.

16. The semiconductor wafer according to claim 13, wherein
the first filling material and the second filling material have a same composition.

17. A semiconductor chip, comprising:
a semiconductor substrate including a chip region and a kerf region located around the chip region;
a device layer including an integrated circuit formed in the chip region; and
a first structure formed in the kerf region by filling a first cavity with a first filling material, the first cavity extending vertically with respect to a surface of a semiconductor substrate, wherein
at least part of an exposed lateral surface of the device layer in the kerf region includes a first film, and
the first film is different in composition from the device layer in the chip region, wherein
a composition of the first film contains at least part of a composition of the first filling material.

18. The semiconductor chip according to claim 17, wherein
from the surface of the semiconductor substrate toward a surface of the device layer in a direction perpendicular to the surface of the semiconductor substrate, a surface of the first film is inclined from the kerf region side toward the device layer, and then inclined from the device layer side toward the kerf region.

19. The semiconductor chip according to claim 17, wherein
the first film is formed of a porous material.

20. The semiconductor chip according to claim 17, wherein
the first film is formed of WSi, W, SiN, SiCN, or a-Si.

* * * * *